United States Patent [19]

Sugiyama et al.

[11] Patent Number: 5,753,536
[45] Date of Patent: May 19, 1998

[54] SEMICONDUCTOR DEVICE AND ASSOCIATED FABRICATION METHOD

[75] Inventors: Tatsuo Sugiyama; Shuji Hirao; Kousaku Yano, all of Osaka; Noboru Nomura, Kyoto, all of Japan

[73] Assignee: Matsushita Electric Industrial Co., Ltd., Osaka, Japan

[21] Appl. No.: 520,252

[22] Filed: Aug. 28, 1995

[30] Foreign Application Priority Data

Aug. 29, 1994 [JP] Japan ................... 6-203845

[51] Int. Cl.[6] ........................... H01L 21/60
[52] U.S. Cl. ........................... 438/108; 438/109
[58] Field of Search ........................... 438/107, 108, 438/109, 118, 119

[56] References Cited

U.S. PATENT DOCUMENTS

| | | | |
|---|---|---|---|
| 4,754,316 | 6/1988 | Reid | 357/68 |
| 4,998,665 | 3/1991 | Hayashi | 228/180 |
| 5,107,586 | 4/1992 | Eichelberger et al. | |
| 5,270,261 | 12/1993 | Bertin et al. | 438/109 |
| 5,466,634 | 11/1995 | Beilstein, Jr. et al. | 438/109 |
| 5,489,804 | 2/1996 | Dasch | 438/108 |
| 5,567,653 | 10/1996 | Bertin et al. | 438/109 |

FOREIGN PATENT DOCUMENTS

| | | |
|---|---|---|
| 0 270 067 | 6/1988 | European Pat. Off. . |
| 41 22 297 | 1/1993 | Germany . |
| 2-246368 | 10/1990 | Japan . |
| 2-278849 | 11/1990 | Japan . |
| 6-29456 | 2/1994 | Japan . |
| 6-77101 | 3/1994 | Japan . |
| WO 91/11833 | 8/1991 | WIPO . |

*Primary Examiner*—Kevin Picardat
*Attorney, Agent, or Firm*—McDermott, Will & Emery

[57] ABSTRACT

A first electrode and a first insulating layer of electrode insulation are formed on a first semiconductor substrate. A second electrode and a second insulating layer of electrode insulation are formed on a second semiconductor substrate. The first semiconductor substrate has at its surface a pattern of recesses/projections (i.e., a pattern of sawteeth in cross section) at regular intervals in stripe arrangement. Likewise, the second semiconductor substrate has at its surface a pattern of recesses/projections (i.e., a pattern of sawteeth in cross section) at regular intervals in stripe arrangement, wherein the pattern of the second semiconductor substrate has a phase shift of 180 degrees with respect to the pattern of the first semiconductor substrate. The first and second semiconductor substrates are bonded together with their patterns in engagement.

23 Claims, 36 Drawing Sheets

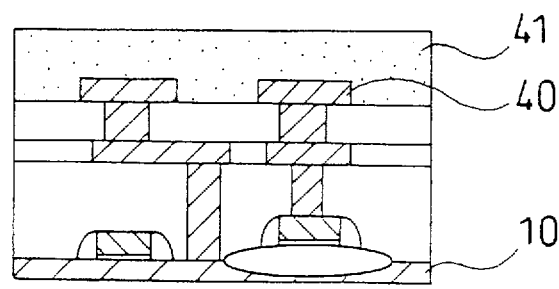
F I G. 9 ( a )
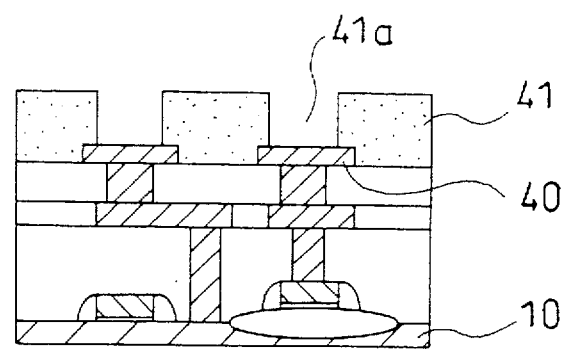
F I G. 9 ( b )
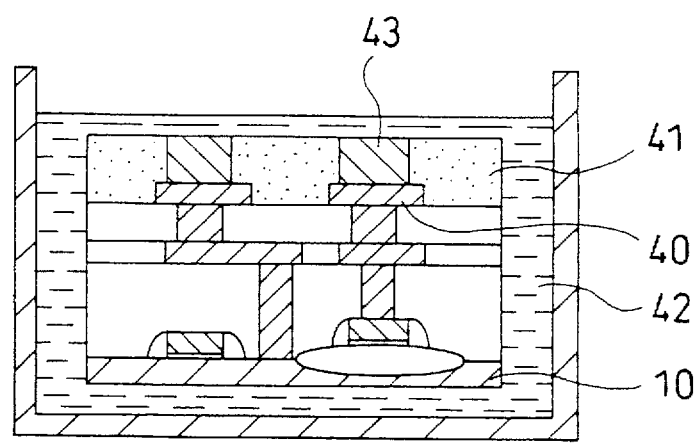
F I G. 9 ( c )
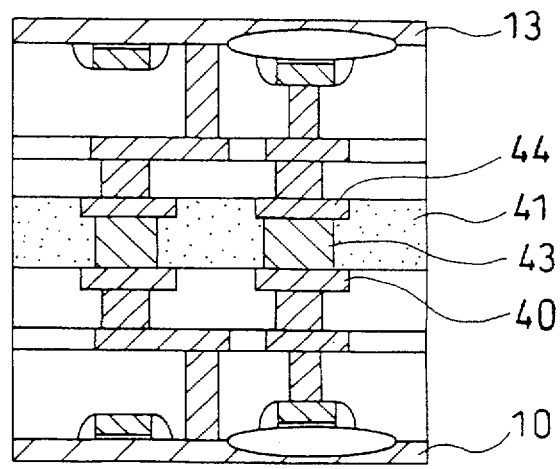
F I G. 9 ( d )

F I G. 12 ( a )
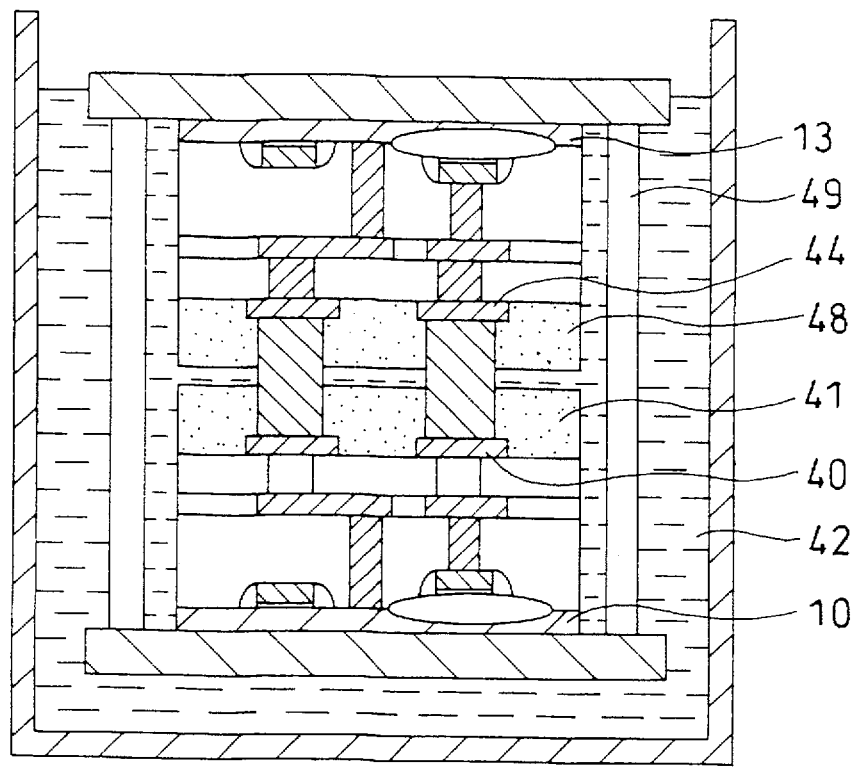
F I G. 12 ( b )
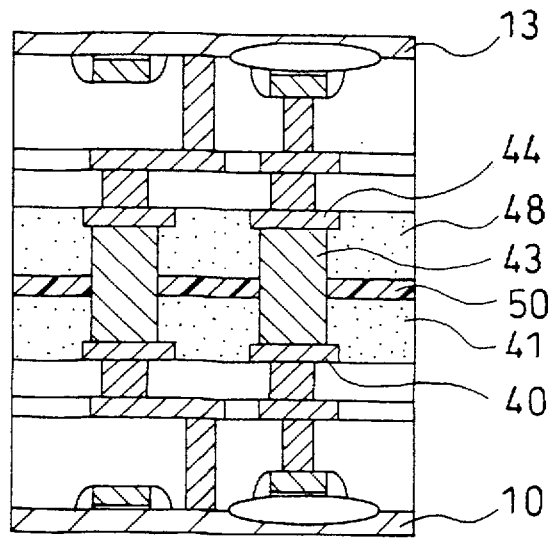

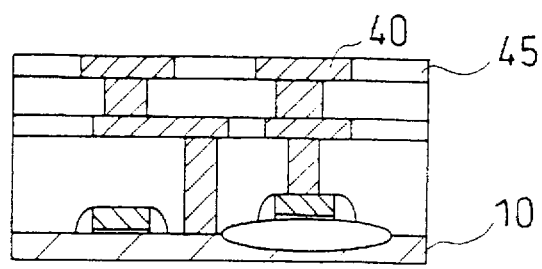
F I G. 20 (a)
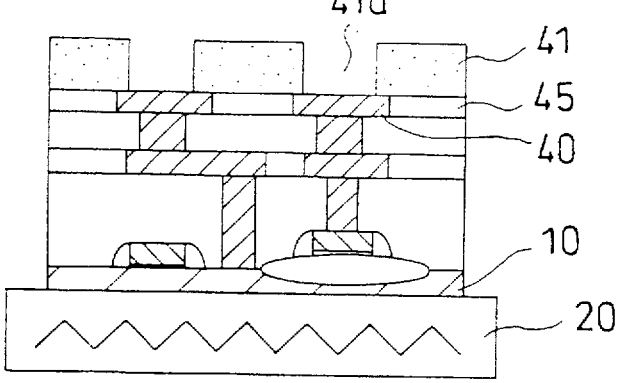
F I G. 20 (b)
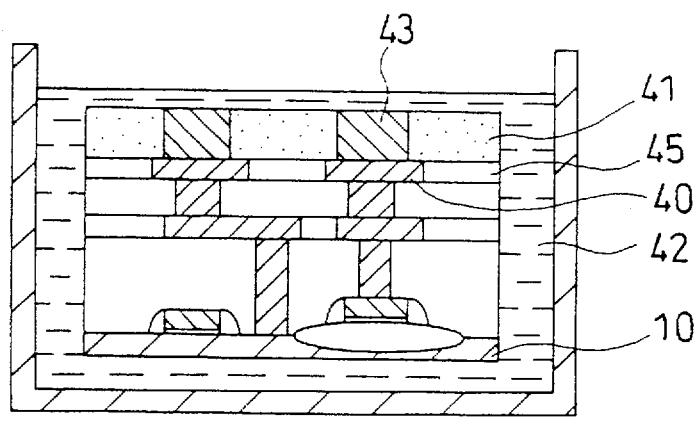
F I G. 20 (c)
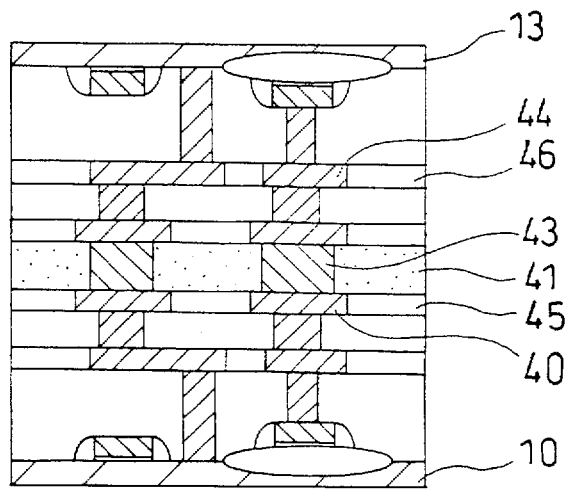
F I G. 20 (d)

F I G. 26 ( a )
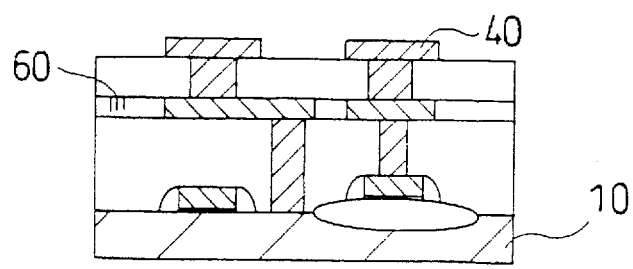
F I G. 26 ( b )
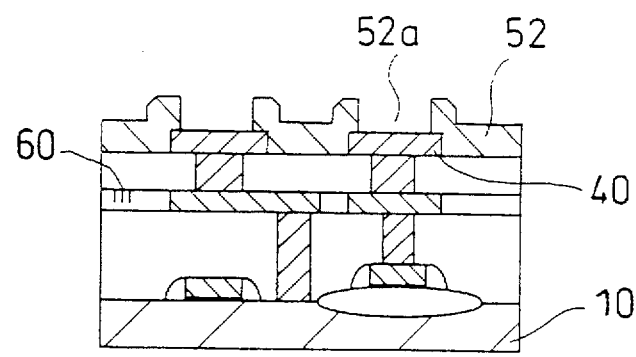
F I G. 26 ( c )
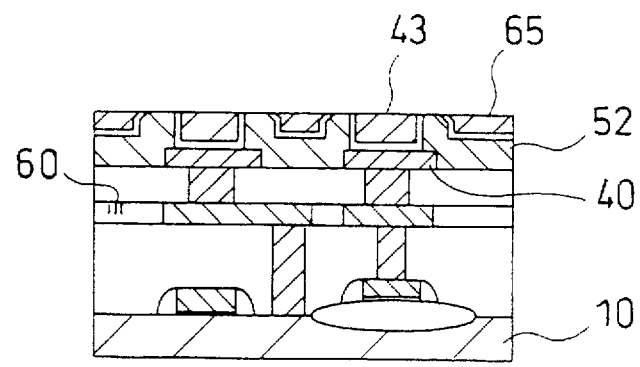
F I G. 26 ( d )
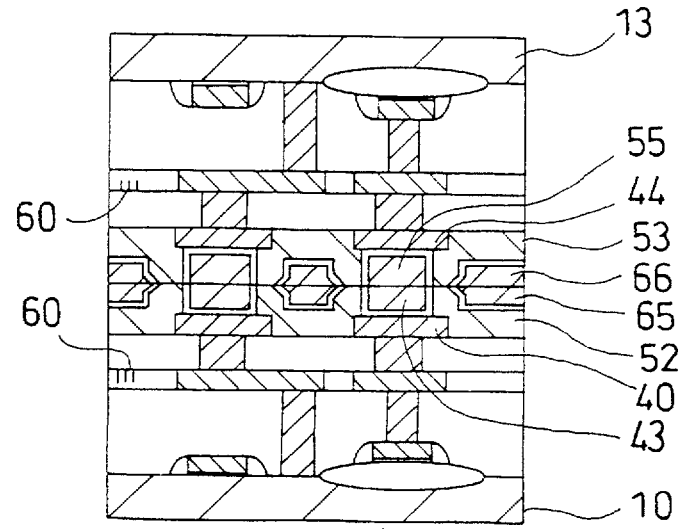

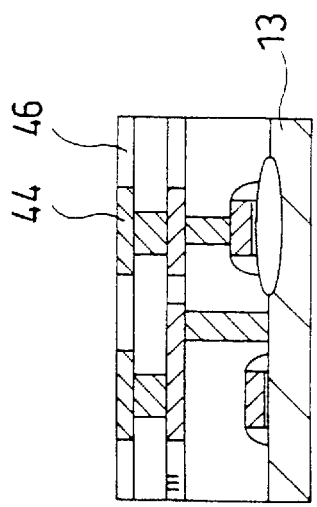
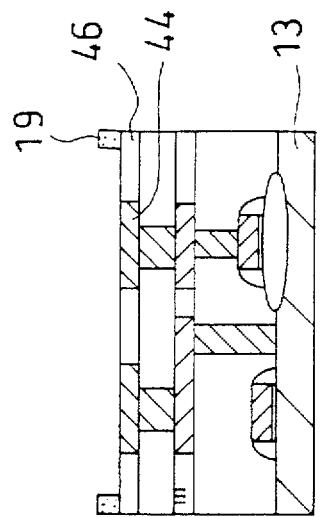
FIG.31(a)
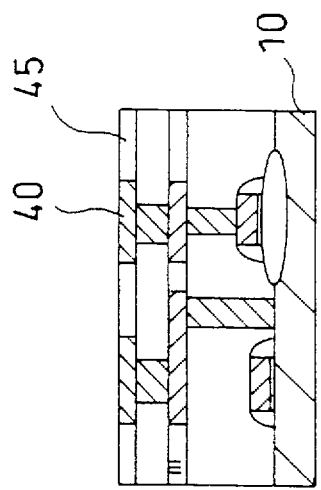
FIG.31(b)
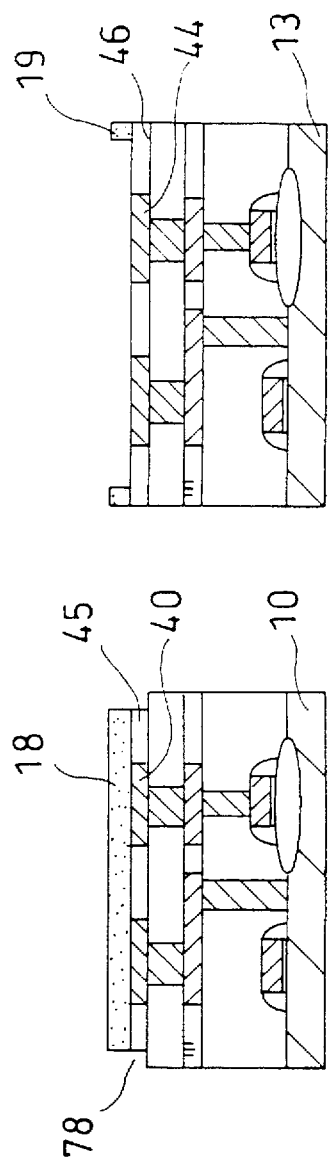
FIG.31(c)

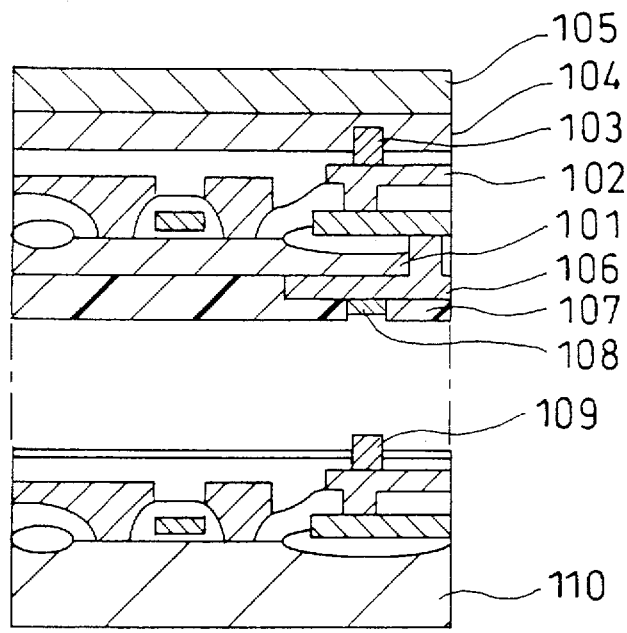
FIG. 34 (a) PRIOR ART
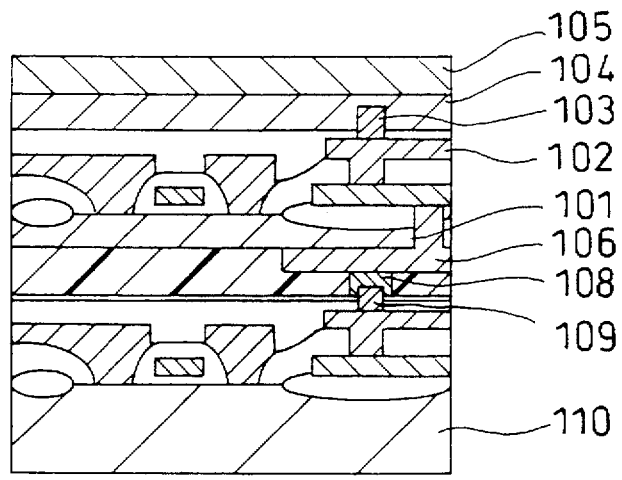
FIG. 34 (b) PRIOR ART
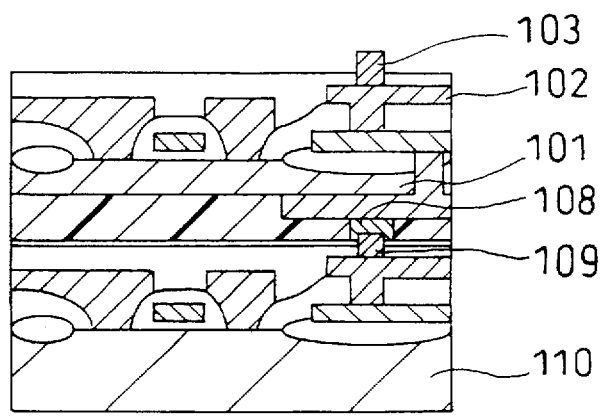
FIG. 34 (c) PRIOR ART

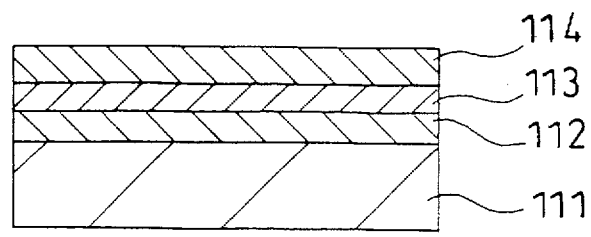
FIG. 35 (a) PRIOR ART
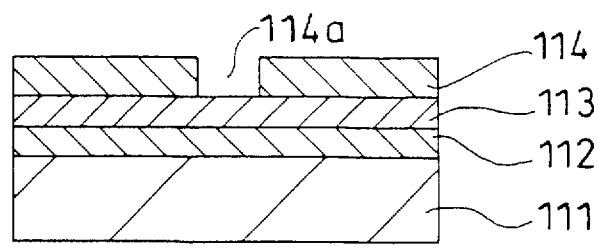
FIG. 35 (b) PRIOR ART
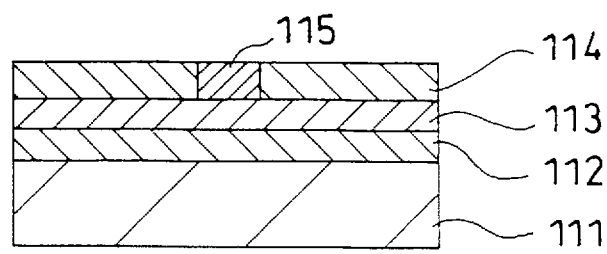
FIG. 35 (c) PRIOR ART
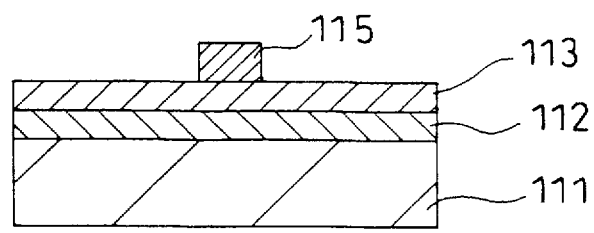
FIG. 35 (d) PRIOR ART
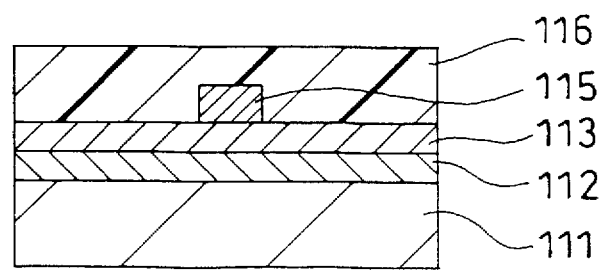
FIG. 35 (e) PRIOR ART
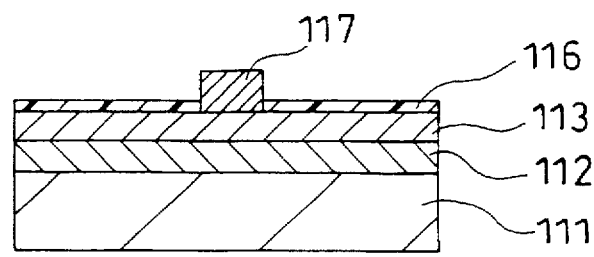
FIG. 35 (f) PRIOR ART

5,753,536

SEMICONDUCTOR DEVICE AND ASSOCIATED FABRICATION METHOD

BACKGROUND OF THE INVENTION

This invention relates to a semiconductor device and to an associated semiconductor device fabrication method. More particularly it pertains to a technique of bonding semiconductor substrates to form a semiconductor device.

Various sophisticated information communicating devices have been developed in which high-performance, multifunctional LSIs play a key role. Three-dimensional (3D) semiconductor devices are now of great interest. Various approaches for fabrication of 3D semiconductor devices have been proposed ("FED-109 Report on Reaching Effects of 3D Circuit Device and Its Future Prospects," October, 1991, by New Function Device Research and Development Association, Foundation). A 3D semiconductor device, formed by laminating two semiconductor substrates with their principal surfaces facing each other, has been considered most attractive because of its convenience and simplicity (M. Yasumoto el al., IEDM (1984) pp. 816–820; Hayashi el al., Symp. of VLSI Tech. (1990), pp. 95–96).

A conventional 3D semiconductor device is now described below. Referring to FIGS. 33(a)–33(c) and FIGS. 34(a)–34(c), a conventional bonding technique for bonding together semiconductor substrates is illustrated.

FIG. 33(a) shows a fabrication step. First wiring 102 of aluminum is formed on a principal surface of first semiconductor substrate 101 having a semiconductor element. First bump 103 of tungsten is selectively formed by means of a CVD process. The principal surface of semiconductor substrate 101 is bonded to supporting material 105 using adhesive 104.

A surface of first semiconductor substrate 101 opposite to the principal surface is polished (FIG. 33(b)). Thereafter, as shown in FIG. 33(c), second wiring 106 of aluminum is formed on the surface of first semiconductor substrate 101 opposite to the principal surface thereof. The surface of first semiconductor substrate 101 opposite to the principal surface thereof is covered with polyimide film 107. An opening region is formed in polyimide film 107. Pool electrode 108 of an alloy of gold and indium is formed in the opening region by means of a lift-off process.

FIG. 34(a) shows a subsequent fabrication step. An alignment step is performed to align the surface of semiconductor substrate 101 opposite to the principal surface thereof and a principal surface of second semiconductor substrate 110 having second bump 109 of tungsten. FIG. 34(b) shows a fabrication step in which first and second semiconductor substrates 101 and 110 are bonded together by application of heat.

Next, as shown in FIG. 34(c), supporting material 105 is removed to form a 2-level semiconductor device. In this 2-level semiconductor device, first bump 103, formed on the first semiconductor substrate, is utilized as a contact terminal for providing connection to an external electrode.

Pool electrode 108 is formed of a gold:indium alloy whose melting point is low enough to bond first and second semiconductor substrates 101 and 102 without bringing second wiring 106 of first semiconductor substrate 101 to a meltdown. Additionally, polyimide film 107 guarantees a good mechanical strength.

Referring now to FIGS. 35(a)–(f), the formation of a bump is described below.

Deposited on a surface of semiconductor substrate 111 are first silicon oxide layer 112, aluminum layer 113, and second silicon oxide layer 114 (see FIG. 35(a)). A photolithography process and a dry etching process are performed to form opening region 114a in second silicon oxide layer 114 (see FIG. 35(b)). Thereafter, as shown in FIG. 35(c), tungsten 115 is embedded into opening region 114a by means of a selective CVD process.

Next, as shown in FIG. 35(d), second silicon oxide 114 is selectively removed by means of an etching process. Semiconductor substrate 111 is then covered with polyimide film 116 (see FIG. 35(e)).

Next, as shown in FIG. 35(f), an organic solvent is used to etch part of polyimide film 116, to form bump 117 of tungsten which corresponds to first bump 103 or second bump 109 of FIG. 34.

Referring now to FIGS. 36(a)–(e), the formation of a pool electrode is illustrated below.

Silicon oxide layer 122, and wiring 123 of tungsten and an aluminum layer are deposited on semiconductor substrate 121, and semiconductor substrate 121 is coated with polyimide film 124 (see FIG. 36(a)).

Next, as shown in FIG. 36(b), resist layer 125 is applied onto polyimide film 124. A lithography process is performed on resist layer 125 to form resist pattern 126 (see FIG. 36(c)). Thereafter, a dry etching process is carried out using resist pattern 126 as an etch mask, to form opening region 124a in polyimide film 124.

Next, as shown in FIG. 36(d), alloy layer 127 of gold and indium is deposited, whereupon opening region 124a is filled up with alloy layer 127. Thereafter, an organic solvent is used to lift resist pattern 126 off from alloy layer 127. In this way, pool electrode 128 is formed which corresponds to pool electrode 108 of FIG. 34.

Although the above-described prior art bonding technique proves to be an adequate method for manufacture of multifunctional semiconductor devices, it represents the problem that the formation of bump 117 of tungsten and pool electrode 128 of a gold:indium alloy requires complicated formation processing.

Additionally the formation of bump 117 and pool electrode 128 increases the number of fabrication steps, resulting in decreasing the yield of semiconductor device and resulting in increasing the cost of semiconductor device production.

Furthermore, in the above-described prior art bonding technique, after a semiconductor substrate having semiconductor elements is bonded to a supporting material, the substrate is polished and is removed from the supporting material. Due to these steps, the degree of warping becomes great when bonded together. This produces the problem that good connection cannot be established between semiconductor substrates to be bonded together.

Additionally, a step of embedding an alloy of gold and indium into an opening region during the pool electrode formation is performed by means of a solder reflow process or the like, in other words it is hard to embed a fine pattern of micron design rules into an opening region.

SUMMARY OF THE INVENTION

Bearing in mind the above-noted problems with the prior art techniques, this invention was made. Therefore, an object of this invention is to provide a semiconductor device fabrication method capable of reducing the number of steps required in bonding semiconductor substrates and capable of reducing the degree of post-bonding warping to improve the reliability of interconnection between semiconductor elements. Another object of this invention is to provide semiconductor devices having fine-patterned opening regions.

The present invention shows a first semiconductor device comprising:

(a) a first semiconductor substrate having:
   a first semiconductor element which is formed on said first semiconductor substrate;
   a plurality of first electrodes which are formed on a principal surface of said first semiconductor substrate and which are electrically connected to said first semiconductor element;
   a first insulating layer which is formed on the principal surface of said first semiconductor substrate and which insulates said plurality of first electrodes; and
   a plurality of projections which are formed on said plurality of first electrodes as well as on said first insulating layer;

(b) a second semiconductor substrate having:
   a second semiconductor element which is formed on said second semiconductor substrate;
   a plurality of second electrodes which are formed on a principal surface of said second semiconductor substrate wherein said plurality of second electrodes correspond in position to said plurality of first electrodes, and which are electrically connected to said second semiconductor element;
   a second insulating layer which is formed on the principal surface of said second semiconductor substrate and which insulates said plurality of second electrodes; and
   a plurality of recesses which are formed on said plurality of second electrodes as well as on said second insulating layer wherein said plurality of recesses correspond in position to said plurality of projections;

wherein:
   said first semiconductor substrate and said second semiconductor substrate are bonded together by bringing said plurality of projections and said plurality of recesses into engagement with one another.

In the first semiconductor device, the first and second semiconductor substrates are bonded together by bringing the projections of the first semiconductor substrate and the recesses of the second semiconductor substrate into engagement with one another. This provides a greater contact area between the substrates thereby bonding them with a greater bonding strength.

In the first semiconductor device, it is preferable that the projections of the first semiconductor substrate and the recesses of the second semiconductor substrate are formed in such a way as to have one- or two-dimensionally the same pattern. This increases the number of projections and the number of recesses therefore increasing the number of bonding points. The first and second semiconductor substrates are bonded together with a much greater bonding strength.

This invention shows a first method of fabricating a semiconductor device comprising:

(a) a first step of:
   forming, on a principal surface of a first semiconductor substrate having a first semiconductor element, a plurality of first electrodes which are electrically connected to said first semiconductor element;
   forming, on the principal surface of said first semiconductor substrate, a first insulating layer for insulating said plurality of first electrodes;
   forming, on a principal surface of a second semiconductor substrate having a second semiconductor element, a plurality of second electrodes which are electrically connected to said second semiconductor element wherein said plurality of second electrodes correspond in position to said plurality of first electrodes; and
   forming, on the principal surface of said second semiconductor substrate, a second insulating layer for insulating said plurality of second electrodes;

(b) a second step of:
   etching said plurality of first electrodes and said first insulating layer of said first semiconductor substrate to form a plurality of projections; and
   etching said plurality of second electrodes and said second insulating layer of said second semiconductor substrate to form a plurality of recesses wherein said plurality of recesses correspond in position to said plurality of projections; and (c) a third step of:
   bonding said first semiconductor substrate and said second semiconductor substrate by bringing said plurality of projections and said plurality of recesses into engagement with each other.

In accordance with the first semiconductor device fabrication method, a plurality of projections and a plurality of recesses are formed by means of an etching process, and these projections and recesses are brought into engagement. This not only eliminates the need for forming bump electrodes and pool electrode required in conventional semiconductor devices but also enables the first and second semiconductor substrates to be aligned with each other automatically. This method, therefore, can bond semiconductor substrates at a great bonding strength to form a semiconductor device, in a simple way and with a less number of steps in comparison with a conventional semiconductor device fabrication method.

In the first semiconductor fabrication method, it is preferable that the second step includes:
   forming, on the first electrodes and on the first insulating layer, a first resist pattern, and thereafter etching the first electrodes and the first insulating layer to form the projections by making use of the first resist pattern as an etch mask;
   forming, on the second electrodes and on the second insulating layer, a second resist pattern in inverting relationship with respect to the first resist pattern and thereafter etching the second electrodes and the second insulating layer to form the recesses by making use of the second resist pattern as an etch mask.

Since projections and recesses are formed by making use of the first and second resist patterns in inverting relationship, this simplifies a way of forming projections and recesses.

This invention provides a second method of fabricating a semiconductor device comprising:

(a) a first step of:
   forming, on a principal surface of a first semiconductor substrate having a first semiconductor element, a plurality of first electrodes which are electrically connected to said first semiconductor element;
   forming, on the principal surface of said first semiconductor substrate, a first insulating layer for insulating said plurality of first electrodes;
   forming, on a principal surface of a second semiconductor substrate having a second semiconductor element, a plurality of second electrodes which are electrically connected to said second semiconductor element wherein said plurality of second electrodes correspond in position to said plurality of first electrodes;

forming, on the principal surface of said second semiconductor substrate, a second insulating layer for insulating said plurality of second electrodes;

(b) a second step of:

planarizing said plurality of first electrodes and said first insulating layer; and planarizing said plurality of second electrodes and said second insulating layer;

(c) a third step of:

aligning said first semiconductor substrate and said second semiconductor substrate such that said plurality of first electrodes and said plurality of second electrodes face one another; and (d) a fourth step of:

press bonding said first semiconductor substrate and said second semiconductor substrate.

In accordance with the second semiconductor device fabrication method, the first semiconductor substrate and the second semiconductor substrate have planarized surfaces that are brought in contact with each other when these substrates are bonded together. This guarantees that the first and second semiconductor substrates contact with each other. This method, therefore, can bond semiconductor substrates at a great bonding strength to form a semiconductor device, in a simple way and with a less number of steps in comparison with a conventional semiconductor device fabrication method.

In the second semiconductor device fabrication method, it is preferable that the second method further comprises forming a molecular layer having dangling bonds on the first electrodes and on the first insulating layer wherein the aforesaid molecular layer forming step is carried out between the second and third steps, and that the fourth step includes bonding the first semiconductor substrate and the second semiconductor substrate by means of chemisorption of the dangling bonds to the second electrodes and the second insulating layer.

Because of such chemisorption the first and second semiconductor substrates are bonded together at a greater bonding strength.

In the second semiconductor device fabrication method, it is preferable that the third step includes aligning the first semiconductor substrate and the second semiconductor substrate in a liquid.

Because of such arrangement, the first and second semiconductor substrates are brought into contact with each other while a liquid trapped between these two substrates is forced out, in other words a liquid exists between the first and second semiconductor substrates until they have come to contact with each other. This not only straightens the warping of the first semiconductor substrate as well as the warping of the second semiconductor substrate but also prevents a sudden contact of the first semiconductor substrate with the second semiconductor substrate, in other words their surfaces are not damaged by contact.

In the second semiconductor device fabrication method, it is preferable that the third step includes:

forming, on the principal surface of the first semiconductor substrate, a first resist pattern, and thereafter etching the first semiconductor substrate to form a recess of alignment by making use of the first resist pattern as an etch mask;

forming, on the principal surface of the second semiconductor substrate, a second resist pattern in inverting relationship with respect to the first resist pattern;

aligning the first semiconductor substrate and the second semiconductor substrate such that the recess and the second resist pattern are brought into engagement with each other.

The first and second semiconductor substrates are aligned with each other by bringing the alignment recess formed in the first semiconductor substrate by means of an etching process using the first resist pattern as an etch mask and the inverting second resist pattern into engagement. This guarantees that the first and second semiconductor substrates are correctly aligned with each other.

In the second semiconductor device fabrication method, it is preferable that the fourth step includes:

holding the first semiconductor substrate and the second semiconductor substrate in alignment in a vacuum atmosphere;

applying a pressure by gas against at least one of surfaces of the first and second semiconductor substrates opposite to the principal surfaces thereof.

As a result of such arrangement, the first semiconductor substrate is aligned with the second semiconductor substrate in a vacuum atmosphere, whereupon the first and second semiconductor substrates are bonded close to each other. Thereafter, at least one of the opposite surfaces of the first and second semiconductor substrates is pressed using gas, whereupon the first and second electrodes are bonded together sharing electrons. This enables the first and second semiconductor substrates to be bonded together at a greater bonding strength.

In the second semiconductor device fabrication method, it is preferable that the fourth step includes press-bonding the first and second semiconductor substrates in alignment while applying heat to the first and second semiconductor substrates. This enables the first and second semiconductor substrates to be bonded together at a greater bonding strength.

In the second semiconductor device fabrication method, it is preferable that the first semiconductor substrate of the first step is transparent and has thereon an alignment mark, and that the second method further comprises a fifth step of:

etching, with the aid of the alignment mark, a surface of the first semiconductor substrate bonded at the fourth step to the second semiconductor substrate opposite to the principal surface thereof, to form an opening region extending to a conductive layer which is formed in the first semiconductor substrate and which is electrically connected to the first electrode; and filling up the opening region with a metallic material, to form on the first semiconductor substrate an extraction electrode that is electrically connected to an external electrode.

As a result of such arrangement, a semiconductor device formed by bonding semiconductor substrates can be accomplished which is capable of easily being connected to an external electrode.

In the second semiconductor device fabrication method, it is preferable that the first step includes forming a first metallic layer that is embedded in the first insulating layer and forming a second metallic layer that is embedded in the second insulating layer wherein the second metallic layer corresponds in position to the first metallic layer, and that the second step includes planarizing the first insulating layer with the first metallic layer embedded therein and planarizing the second insulating layer with the second metallic layer embedded therein, and that the fourth step includes bonding the first metallic layer and the second metallic layer.

As a result of such arrangement, the first metallic layer embedded in the first insulating layer and the second metallic layer embedded in the second insulating layer are bonded together. This increases the number of bonding portions between the first and second semiconductor substrates thereby enabling the first and second semiconductor substrates to be bonded together at a greater bonding strength.

This invention shows a third method of fabricating a semiconductor device comprising:

(a) a first step of:

forming, on a principal surface of a first semiconductor substrate having a first semiconductor element, a first interconnect line that is electrically connected to said first semiconductor element; and forming, on a principal surface of a second semiconductor substrate having a second semiconductor element, a second interconnect line that is electrically connected to said second semiconductor element;

(b) a second step of:

forming, on the principal surface of said first semiconductor substrate having said first interconnect line, a first interlayer insulating film having therein a first opening region wherein said first opening region corresponds in position to said first interconnect line;

forming, on the principal surface of said second semiconductor substrate having said second interconnect line, a second interlayer insulating film having therein a second opening region wherein said second opening region corresponds in position to said second interconnect line and to said first opening region;

(c) a third step of:

filling up said first and second opening regions with metal by means of an electroless plating process so as to form an electrode for establishing a connection between said first interconnect line and said second interconnect line; and (d) a fourth step of:

bonding said first semiconductor substrate and said second semiconductor substrate by applying an insulating resin therebetween.

Such arrangement prevents interfaces between the first and second interconnect lines and a metal of connection from being contaminated, thereby improving the reliability of electrical interconnection and the strength of interconnection. Additionally, the step of interconnecting the first and second interconnect lines is simplified. Therefore, semiconductor substrates are bonded together at a greater bonding strength to form a semiconductor device in a simple way and with a less number of steps in comparison with a conventional semiconductor device fabrication step.

In the third semiconductor device fabrication method, it is preferable that the first step includes:

forming, on the principal surface of the first semiconductor substrate having the first interconnect line, a first insulating layer for insulating the first interconnect line wherein the first insulating layer is located at the same level as the first interconnect line;

forming, on the principal surface of the second semiconductor substrate having the second interconnect line, a second insulating layer for insulating the second interconnect line wherein the second insulating layer is located at the same level as the second interconnect line.

Such arrangement provides a greater contact area between the first and second semiconductor substrates, whereupon the first and second semiconductor substrates are bonded together at a greater bonding strength.

In the third semiconductor device fabrication method, it is preferable that both the first interlayer insulating film and the second interlayer insulating film of the second step are resist patterns.

As a result of such arrangement, the first and second interlayer insulating films sandwiched between the first and second semiconductor substrates are formed of resist patterns. This simplifies the step of forming opening regions in the first and second interlayer insulating layers, therefore reducing the number of steps of the fabrication of semiconductor devices.

In the third semiconductor device fabrication method, it is preferable that both the first interlayer insulating film and the second interlayer insulating film of the second step are silicon oxide layers. As a result of such arrangement, the first and second interlayer insulating films are formed of silicon oxide thereby improving the degree of insulation between the first and second semiconductor substrates.

In the third semiconductor device fabrication method, it is preferable that the first semiconductor substrate of the first step is transparent and has thereon an alignment mark, and that the fabrication method further comprises a fifth step of:

etching, with the aid of said alignment mark, a surface of the first semiconductor substrate bonded at the fourth step to the second semiconductor substrate opposite to the principal surface thereof, to form an opening region extending to a conductive layer which is formed in the first semiconductor substrate and which is electrically connected to the first electrode;

filling up the opening region with a metallic material, to form in the first semiconductor substrate an extraction electrode that is electrically connected to an external electrode.

As a result of such arrangement, a semiconductor device formed by bonding semiconductor substrates can be accomplished which is capable of easily being connected to an external electrode.

This invention discloses a fourth method of fabricating a semiconductor device comprising:

(a) a first step of:

forming, on a principal surface of a first semiconductor substrate having a first semiconductor element, a first interconnect line that is electrically connected to said first semiconductor element; and forming, on a principal surface of a second semiconductor substrate having a second semiconductor element, a second interconnect line that is electrically connected to said second semiconductor element;

(b) a second step of:

forming, on the principal surface of said first semiconductor substrate having said first interconnect line, a resist pattern having an opening region wherein said opening region corresponds in position to said first interconnect line;

(c) a third step of:

filling up said opening region of said resist pattern with metal to form an electrode of connection;

(d) a fourth step of:

aligning said first and second semiconductor substrates such that said connection electrode and said second interconnect line are connected together, and press-bonding said first semiconductor substrate and said second semiconductor substrate while heating said first and second semiconductor substrates.

As a result of such arrangement, the step of forming an opening region in which a metal used to form an electrode of connection is embedded is simplified, whereupon semiconductor substrates are bonded together at a greater bonding strength to form a semiconductor device in a simple way and with a less number of steps in comparison with a conventional semiconductor device fabrication step.

In the fourth semiconductor substrate device fabrication method, it is preferable that the first step includes:

forming, on the principal surface of the first semiconductor substrate having the first interconnect line, a first insulating layer for insulating the first interconnect line wherein the first insulating layer is located at the same level as the first interconnect line;

forming, on the principal surface of the second semiconductor substrate having the second interconnect line, a second insulating layer for insulating the second interconnect line wherein the second insulating layer is located at the same level as the second interconnect line.

A resist pattern is formed after the first insulating layer is formed on the first semiconductor substrate at the same level as the first interconnect line, as a result of which the resist pattern has a smooth surface. Additionally, as a result of the above-described arrangement, the second insulating layer of the second semiconductor substrate, too, has a smooth surface. This provides a greater contact surface between the first and second semiconductor substrates, whereupon the first and second semiconductor substrates are bonded together at a greater bonding strength.

In the fourth semiconductor substrate device fabrication method, it is preferable that the second step includes bringing the resist pattern to a thermoset by application of heat. The resist pattern, since it becomes hard by application of heat, does not take in moisture. This not only prevents an electrode of connection from suffering corrosion but also prevents an electrode of connection from suffering delamination due to shrinkage of a resist pattern caused by application of heat to bond the first and second semiconductor substrates.

In the fourth semiconductor substrate device fabrication method, it is preferable that the third step includes selectively forming the connection electrode by means of an electroless plating process. Such arrangement prevents interfaces between the first and second interconnect lines and a metal of connection from being contaminated, thereby improving the reliability of electrical interconnection and the strength of interconnection. Additionally, the step of interconnecting the first and second interconnect lines is simplified.

It is preferable that the fourth semiconductor substrate device fabrication method further comprises:

a fifth step of:

removing the resist pattern sandwiched at the fourth step between the first semiconductor substrate and the second semiconductor substrate;

applying either a spin-on-glass or a thermoset resin between the first semiconductor substrate and the second semiconductor substrate;

bringing said spin-on-glass to a set to form an interlayer insulating film.

Such arrangement not only increases the strength of an insulating layer lying between the first and second semiconductor substrates but also controls the dielectric constant. Additionally, the removal of the resist pattern prevents a bonding portion where the first and second interconnect lines and the connection electrode are bonded from delaminating.

In the fourth semiconductor substrate device fabrication method, it is preferable that the first semiconductor substrate of the first step is transparent and has thereon an alignment mark, and that the fabrication method further comprises a fifth step of:

etching, with the aid of the alignment mark, a surface of the first semiconductor substrate bonded at the fourth step to the second semiconductor substrate opposite to the principal surface thereof, to form an opening region extending to a conductive layer which is formed in the first semiconductor substrate and which is electrically connected to the first electrode;

filling up the opening region with a metallic material, to form in the first semiconductor substrate an extraction electrode that is electrically connected to an external electrode.

As a result of such arrangement, a semiconductor device formed by bonding semiconductor substrates can be provided which is capable of easily being connected to an external electrode.

This invention provides a fifth method of fabricating a semiconductor device comprising:

(a) a first step of:

forming, on a principal surface of a first semiconductor substrate having a first semiconductor element, a first electrode which is electrically connected to said first semiconductor element; and forming, on a principal surface of a second semiconductor substrate having a second semiconductor element, a second electrode which is electrically connected to said second semiconductor element;

(b) a second step of:

forming, on a surface of said first semiconductor substrate opposite to said principal surface thereof, a first insulating layer capable of concaving the principal surface of said first semiconductor substrate; and forming, on a surface of said second semiconductor substrate opposite to said principal surface thereof, a second insulating layer capable of concaving said principal surface of said second semiconductor substrate;

(c) a third step of:

aligning said first and second semiconductor substrates such that said first and second electrodes face each other, and press-bonding said first and second semiconductor substrates while heating said first and second semiconductor substrates.

As a result of such arrangement, low strain produced in the first and second semiconductor substrates can be absorbed by great strain. Therefore, uniform application of pressure to the first and second semiconductor substrates is possible when bonding them. The first and second semiconductor substrates are bonded together at a greater bonding strength and are aligned with each other easily.

In the fifth semiconductor device fabrication method, it is preferable that both the first insulating layer and the second insulating layer of the second step are silicon nitride layers. Such arrangement produces the advantage that the amount of warping of the first and second semiconductor substrates can be controlled by controlling the film thickness and the formation conditions of silicon nitride layers.

BRIEF DESCRIPTION OF THE DRAWINGS

FIGS. 9(a, b, c, d) are a series of cross-sectional views which illustrate a sequence of process steps used in fabricating a semiconductor device according to a fifth embodiment of this invention.

FIGS. 20(a, b, c, d) are a series of cross-sectional views which illustrate a sequence of process steps used in fabricating a semiconductor device according to a ninth embodiment of this invention.

FIGS. 26(a, b, c, d) are a series of cross-sectional views which illustrate a sequence of process steps used in fabricating a semiconductor device according to a twelfth embodiment of this invention.

FIGS. 31(a, b, c) through 32(a, b) are a series of cross-sectional views which illustrate a sequence of process steps used in fabricating a semiconductor device according to a sixteenth embodiment of this invention.

DETAILED DESCRIPTION OF THE INVENTION

Preferred embodiments of the present invention are now described below with reference to the accompanying drawing figures.

EMBODIMENT 1

Figure 1:
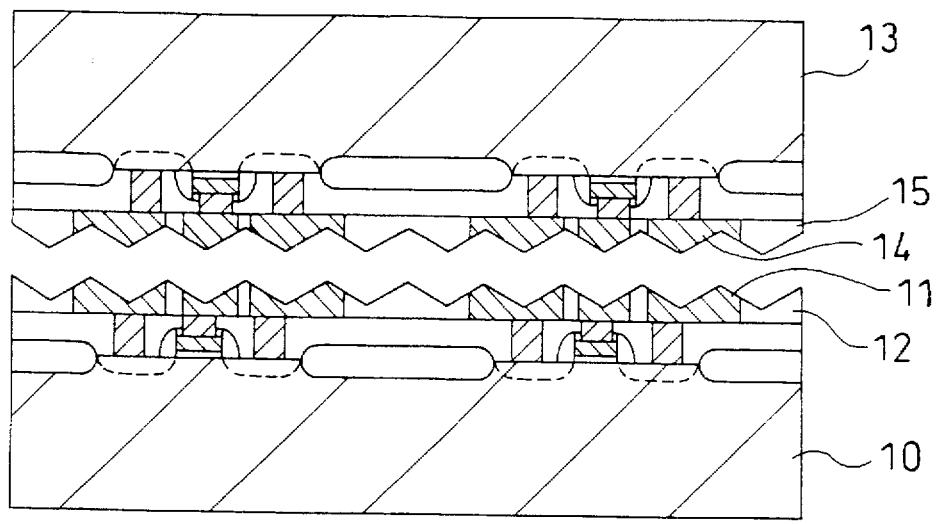
FIG. 1 depicts a cross-sectional view of a semiconductor device according to a first embodiment of this invention.

A semiconductor device according to the first embodiment of this invention is described. Referring to FIG. 1, first electrode 11 and first insulating layer 12 of electrode insulation are formed on first semiconductor substrate 10 which has semiconductor elements. Second electrode 14 and second insulating layer 15 of electrode insulation are formed on second semiconductor substrate 13 having semiconductor elements. The surface patterning of first semiconductor substrate 10 is carried out such that first semiconductor substrate 10 has at its surface a pattern of recesses/projections (i.e., a pattern of sawteeth in cross section) at regular intervals in stripe arrangement. Likewise, the surface patterning of second semiconductor substrate 13 is carried out such that second semiconductor substrate 13 has at its surface a pattern of recesses/projections (i.e., a pattern of sawteeth in cross section) at regular intervals in stripe arrangement, wherein the pattern of second semiconductor substrate 13 has a phase shift of 180 degrees with respect to the pattern of first semiconductor substrate 10. As a result, first and second semiconductor substrates 10 and 13 are bonded together with their patterns in engagement. In FIG. 1, for the sake of convenience, first and second semiconductor substrates 10 and 13 are illustrated having a space therebetween.

Because of such patterns, first semiconductor substrate 10 and second semiconductor substrate 13 can automatically be aligned with each other for interconnection. Additionally semiconductor substrates 10 and 13 are bonded together at a larger area thereby providing a greater bonding strength.

Apart from the above-described surface pattern, other types of patterns may be used, for example, a pattern of rectangles in cross section in stripe arrangement and a pattern of projections in plan in checkerboard arrangement wherein each plane rectangular projection is shifted from another in the x-axis direction as well as in the y-axis direction.

With reference to FIGS. 2(a, b) and FIGS. 3(a, b), the fabrication of a semiconductor device of the present embodiment is described. In the present embodiment, a pattern of recesses/projections which are rectangular in cross section is used.

Figure 2A:
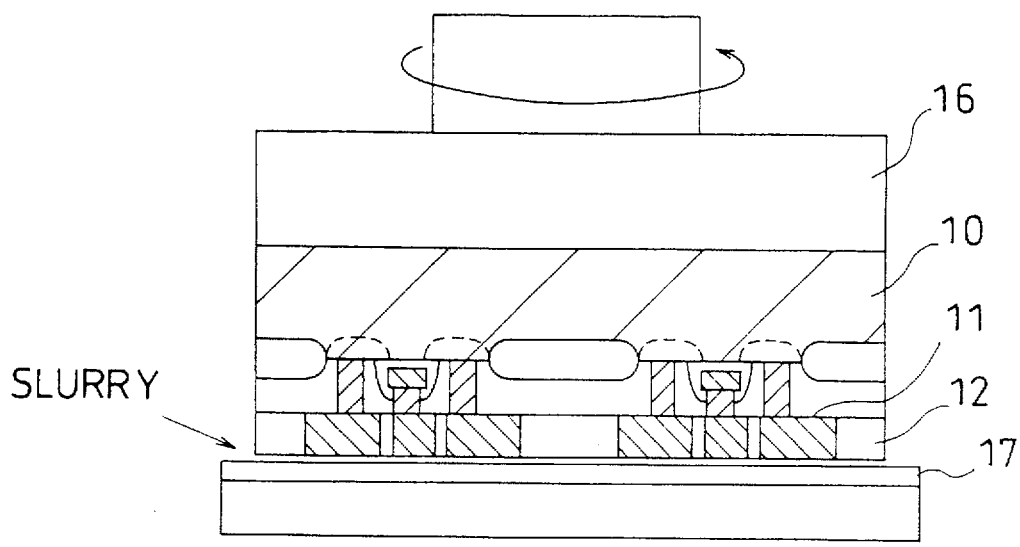
FIGS. 2(a, b) through 3(a, b) are a series of cross-sectional views which illustrate a sequence of process steps used in fabricating a semiconductor device according to the first embodiment of this invention.
Figure 3A:
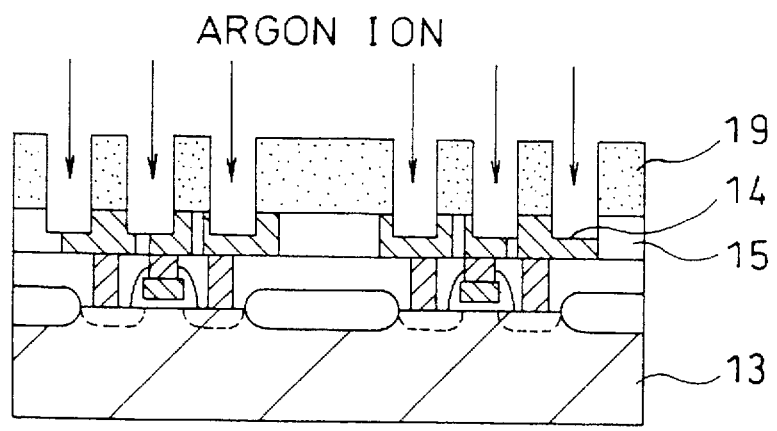

Referring now to FIG. 2(a), first electrode 11 is formed on first semiconductor substrate 10 having semiconductor elements. This is followed by the deposition of first insulating layer 12 of electrode insulation on first semiconductor substrate 10. With first semiconductor substrate 10 held by substrate retainer 16, first insulating layer 12 is polished using polishing pad 17 while at the same time applying a polishing slurry until the time first electrode 11 becomes exposed, to planarize the surface of first semiconductor substrate 10.

Figure 2B:
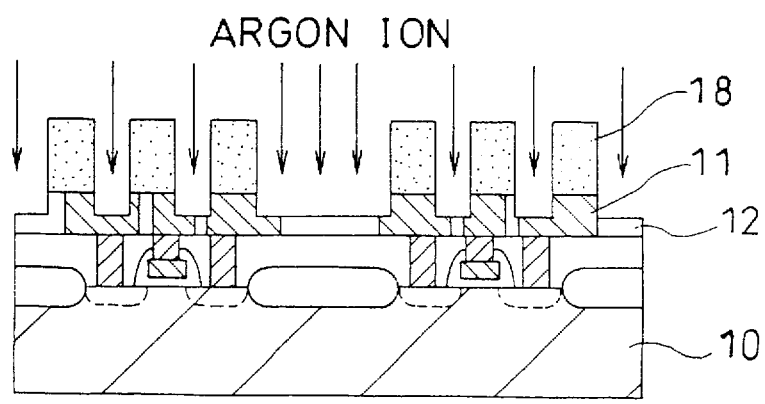

Referring now to FIG. 2(b), following the formation of first resist pattern 18 having opening regions at regular intervals in first semiconductor substrate 10, a milling process with argon ions is carried out on first electrode 11 and on first insulating layer 12 using first resist pattern 18 as a mask, whereupon a first pattern of recesses/projections having a rectangular cross section is formed on first semiconductor substrate 10.

Likewise, second electrode 14 and second insulating layer 15 of electrode insulation are formed on second semiconductor substrate 13. Second semiconductor substrate 13 is then planarized (see FIG. 3(a)).

Next, second resist pattern 19 is formed on second semiconductor substrate 13 such that second resist pattern 19 is an inverting pattern with respect to first resist pattern 18. Using second resist pattern 19 as a mask, a milling with argon ions is carried out on second electrode 14 and on second insulating layer 15, to form a second pattern of recesses/projections having a rectangular cross section on second semiconductor substrate 13, the second pattern having a phase shift of 180 degrees with respect to the first pattern of first semiconductor substrate 10.

Figure 3B:
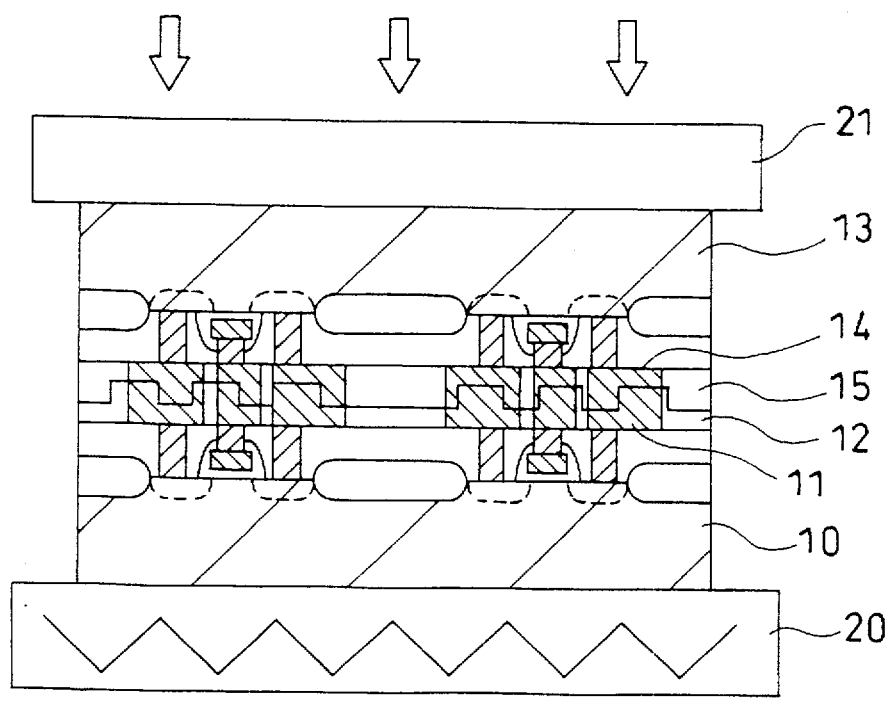

Referring now to FIG. 3(b), first semiconductor substrate 10 and second semiconductor substrate 13 are placed such that both the substrates 10 and 13 face each other with their patterns in engagement. While applying heat to first and second semiconductor substrates 10 and 13 by means of heat plate 20, they are pressed to each other by press plate 21 to be bonded together.

If each of first and second insulating layers 12 and 15, like a plasma oxide layer, contains many hydroxyl groups (—OH), and if the heating temperature is above 400 degrees centigrade, then first and second insulating layers 12 and 15 can be bonded together sufficiently because of dehydration. If first and second insulating layers 12 and 15 are formed of polyimide, and if the heating temperature is above 300 degrees centigrade, then first and second insulating layers 12 and 15 can be bonded together sufficiently.

A pattern of recesses/projections used in the present embodiment can be formed by a conventional processing technique, which means that no extra manufacture equipment is needed, thereby cutting down the cost of production.

EMBODIMENT 2

Figure 4A:
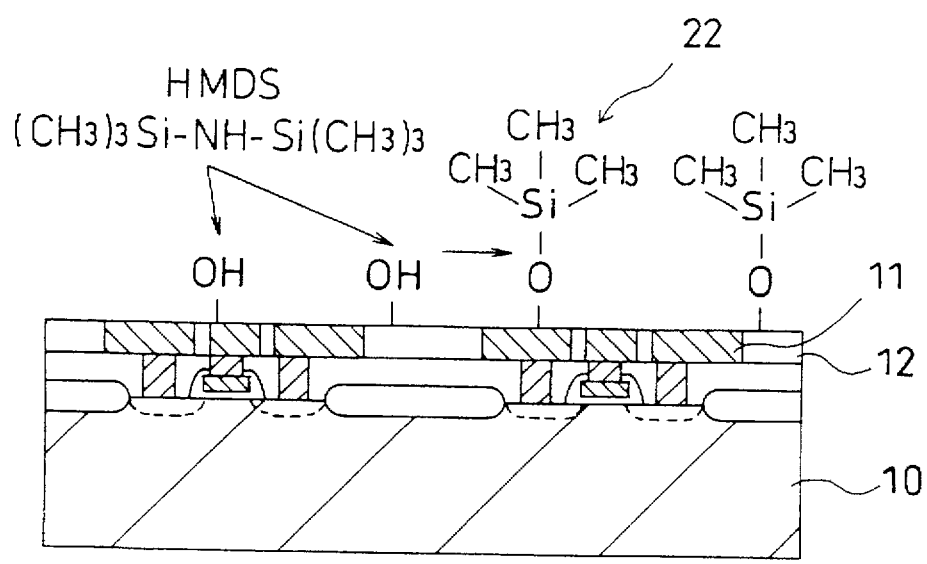
FIGS. 4(a, b) through 5(a, b) are a series of cross-sectional views which illustrate a sequence of process steps used in fabricating a semiconductor device according to a second embodiment of this invention.
Figure 4B:
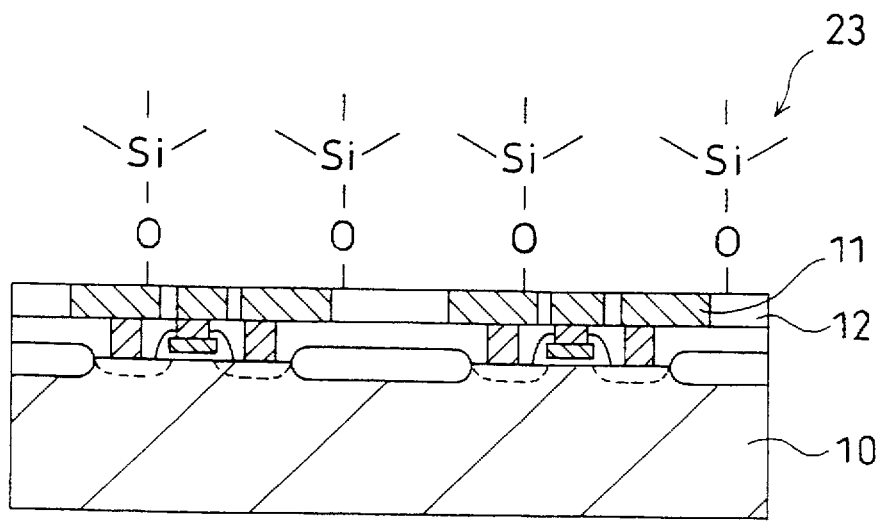
Figure 5A:
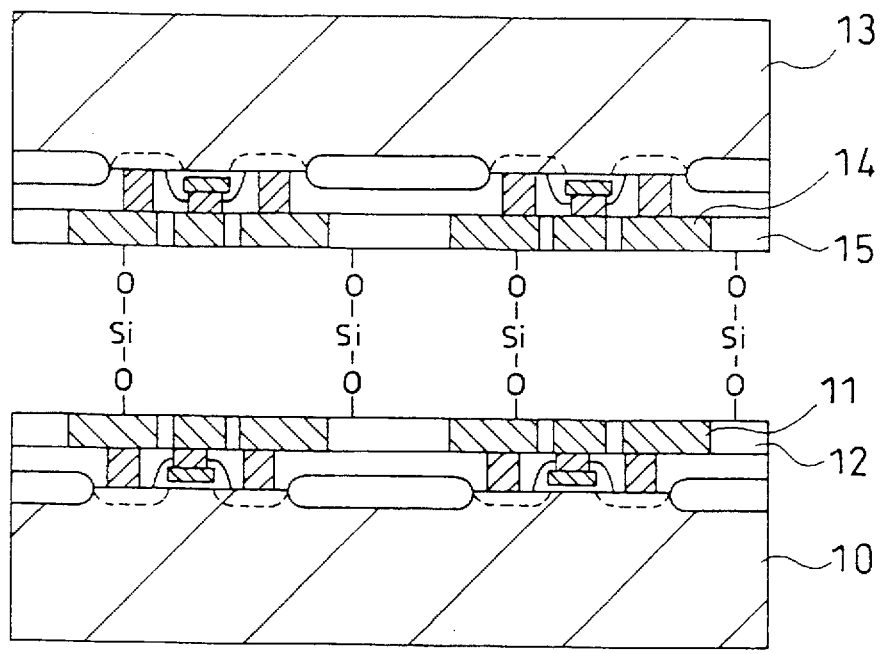
Figure 5B:
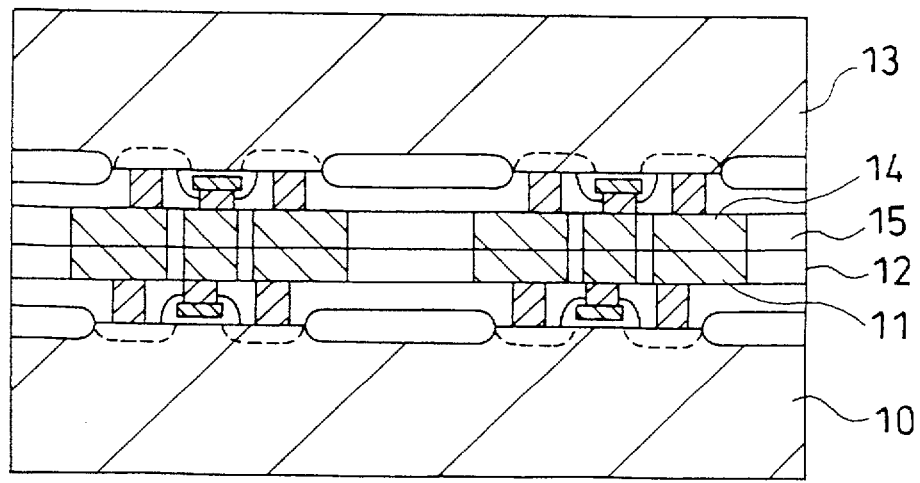

Referring now to FIGS. 4(a, b) and FIGS. 5(a)–(b), the fabrication of a semiconductor device of the second embodiment of this invention is described.

Referring first to FIG. 4(a), first electrode 11 and first insulating layer 12 of electrode insulation are formed on first semiconductor substrate 10. The surfaces of first electrode 11 and first insulating layer 12 are in contact with moisture contained in the air, therefore being covered with hydroxyl (—OH) groups. So, the surfaces of first electrode 11 and first insulating layer 12 are exposed to vapors of hexamethyldisilazane ((Si(CH$_3$)$_3$)$_2$NH), abbreviated HMDS, for the replacement of a hydrogen (—H) of a hydroxyl group (—OH) with a Si(CH$_3$)$_3$ group. This results in the formation of a monomolecular layer 22 composed of Si(CH$_3$)$_3$ on first semiconductor substrate 10. In a Si(CH$_3$)$_3$ group, the Si—(CH$_3$)$_3$ bond is weak and a methyl group is eliminated from the Si(CH$_3$)$_3$ group with time, to form dangling bond 23 (see FIG. 4(b)).

As shown in FIGS. 5(a, b), second electrode 14 and second insulating layer 15 of electrode insulation are formed on second semiconductor substrate 13 having semiconductor elements, and first and second semiconductor substrates 10 and 13 are bonded together with their surfaces facing each other. First semiconductor substrate 10 has on its surface dangling bond 23 and the surface of first semiconductor substrate 10 is chemically in the excited state, so that dangling bond 23 of first semiconductor substrate 10 is bound to a hydroxyl group. This provides a great bonding strength to bond first and second semiconductor substrates 10 and 13.

A great number of dangling bonds 23 may be formed on first semiconductor substrate 10 by irradiating first semiconductor substrate 10 with ultraviolet light or by heating first semiconductor substrate 10 up to 400 degrees centigrade. This provides a greater bonding strength to bond first and second semiconductor substrates 10 and 13.

EMBODIMENT 3

Figure 6A:
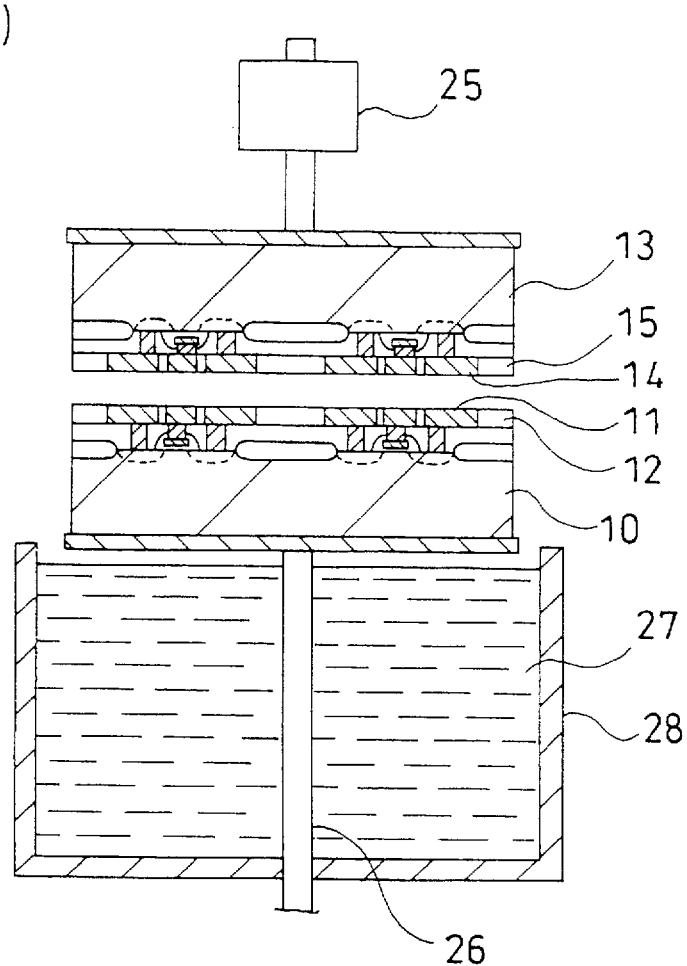
FIGS. 6(a, b) are a series of cross-sectional views which illustrate a sequence of process steps used in fabricating a semiconductor device according to a third embodiment of this invention.
Figure 6B:
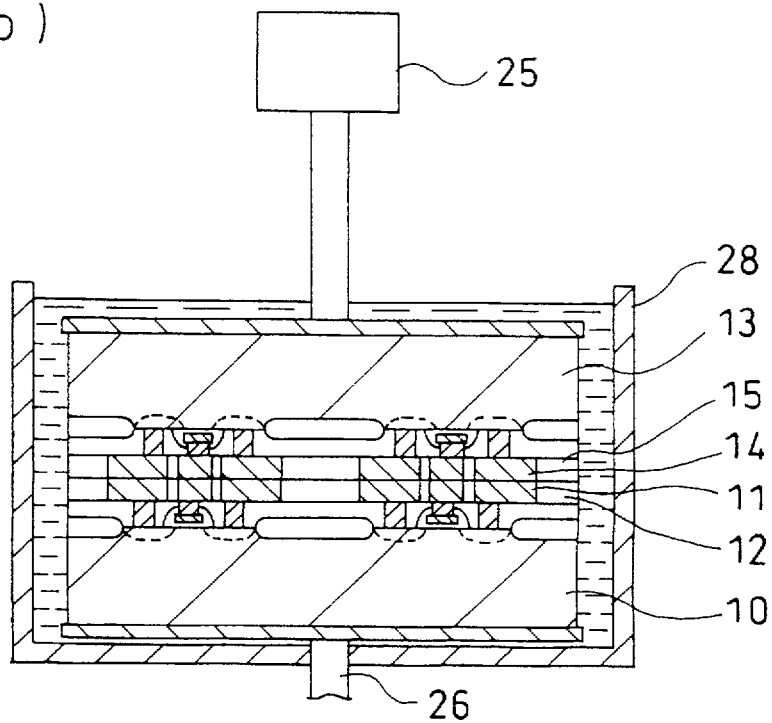

Referring now to FIGS. 6(a, b), the fabrication of a semiconductor device of the third embodiment of this invention is described.

As shown in FIG. 6(a), first electrode 11 and first insulating layer 12 of electrode insulation are formed on first semiconductor substrate 10 having semiconductor elements, while second electrode 14 and second insulating layer 15 of electrode insulation are formed on second semiconductor substrate 13 having semiconductor elements.

Next, with first semiconductor substrate 10 and second semiconductor substrate 13 facing each other, second semiconductor substrate 13 is held by upper retainer 25 having a four-axis (x-y-z-θ) control mechanism while on the other hand first semiconductor substrate 10 is held by lower retainer 26 capable of vertical movement. Thereafter, upper and lower retainers 25 and 26 are moved downward and first and second semiconductor substrates 10 and 13 are accommodated in receptacle 28 filled with pure water 27 free from particles.

Upper retainer 26 is moved in x-y-z-θ directions in receptacle 28 for the alignment of first semiconductor substrate 10 with second semiconductor substrate 13.

Because of such an alignment step carried out in receptacle 28, first and second semiconductor substrates 10 and 13 are brought into contact with each other while pure water 27 between these two substrates is being forced out. Pure water 27 exists between first and second semiconductor substrates 10 and 13 until they have come to contact with each other, and this not only straightens the warping of first semiconductor substrate 10 as well as the warping of second semiconductor substrate 13 but also prevents a sudden contact of first semiconductor substrate 10 with second semiconductor substrate 13, in other words their surfaces are not damaged by contact.

First and second semiconductor substrates 10 and 13 in contact with each other are taken out of receptacle 28 and are heated to be press bonded together. In this way, first and second semiconductor substrates 10 and 13 are bonded together.

In the present embodiment, receptacle 28 is filled with pure water 27. Apart from pure water 27, other liquid materials that do not corrode semiconductor substrates may be used, e.g., alcohol.

Figure 7A:
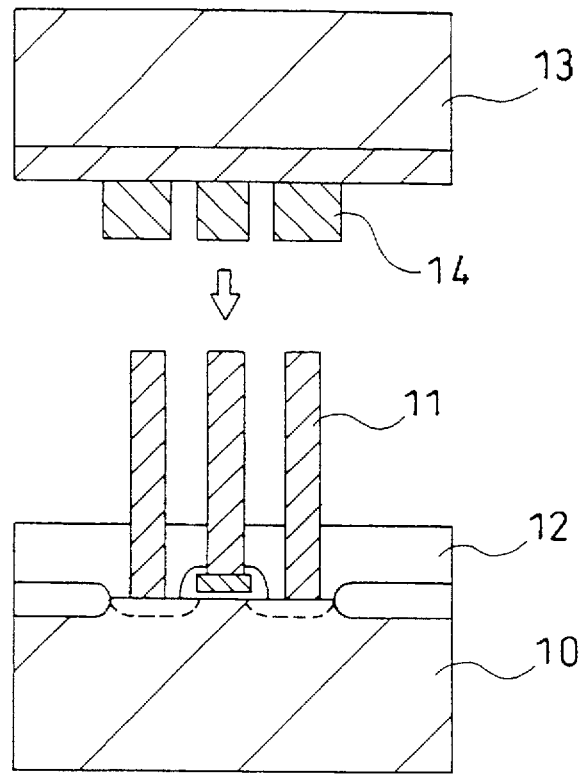
FIGS. 7(a, b) are a series of cross-sectional views which illustrate an example of the semiconductor substrate employed in the third embodiment of this invention.
Figure 7B:
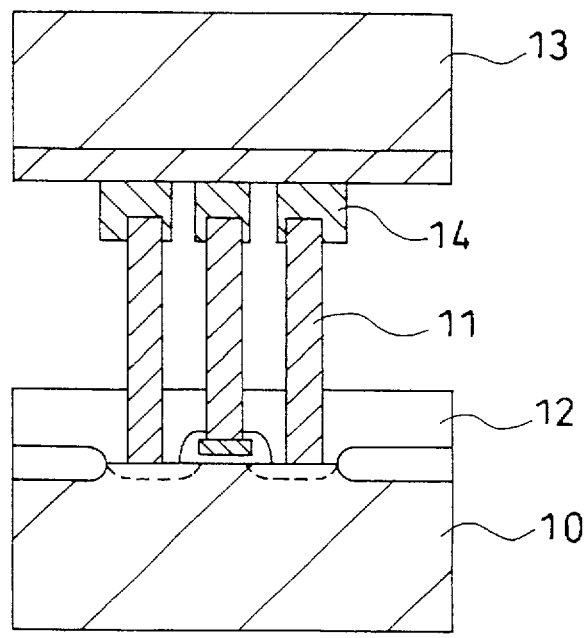

An example of the semiconductor substrate used in the third embodiment of this invention is illustrated (see FIGS. 7(a, b)). Formed on first semiconductor substrate 10 is first electrode 11 in the form of a column composed of polysilicon heavily doped with impurities. Second electrode 14 composed of an aluminum alloy is formed on second semiconductor substrate 13. First semiconductor substrate 10 and second semiconductor substrate 13 are pressed to each other, so that the leading end of first electrode 11 is driven into second electrode 14, with a space between first and second semiconductor substrates 10 and 13. Such a space reduces the electrical capacitance between first semiconductor substrate 10 and second semiconductor substrate 13. Thereafter, a packaging step is carried out, either with a space between first and second semiconductor substrates 10 and 13 or with a space sealed with a resin.

EMBODIMENT 4

Referring now to FIGS. 8(a, b), the fabrication of a semiconductor device of the fourth embodiment is illustrated.

The fourth embodiment employs bonding device 30 capable of bonding semiconductor substrates (see FIG. 8). This bonding device 30 comprises chamber 31 which is airtight, exhaust 32 for drawing gas out of chamber 31, gas inlet 33 at which gas such as air and nitrogen is introduced into chamber 31, upper retainer 25 having a four-axis control mechanism for holding and shifting second semiconductor substrate 13 in directions of x-y-z-θ, and lower retainer 26 for holding and shifting first semiconductor substrate 10 in a direction of z.

Figure 8A:
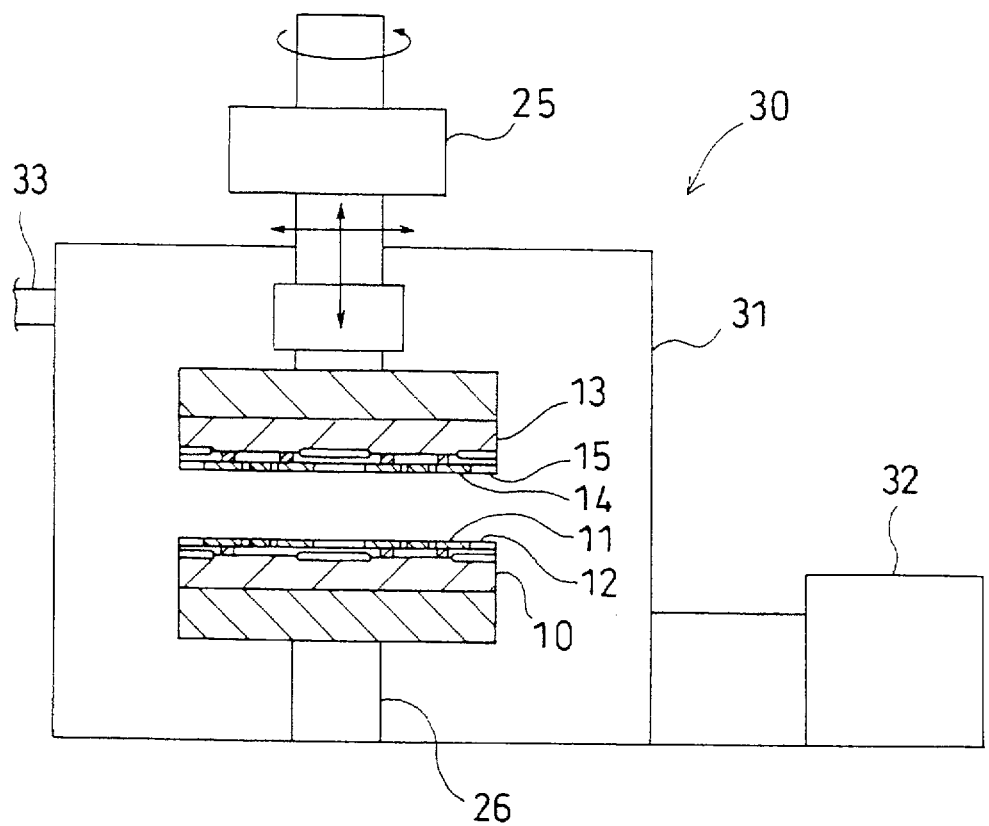
FIGS. 8(a, b) are a series of cross-sectional views which illustrate a sequence of process steps used in fabricating a semiconductor device according to a fourth embodiment of this invention.

As shown in FIG. 8(a), first electrode 11 and first insulating layer 12 of electrode insulation are formed on first semiconductor substrate 10 having semiconductor elements, while second electrode 14 and second insulating layer 15 of electrode insulation are formed on second semiconductor substrate 13 having semiconductor elements.

With the surfaces of first and second semiconductor substrates 10 and 13 facing each other, second semiconductor substrate 13 is held by upper retainer 25 while first semiconductor substrate 10 is held by lower retainer 26. Thereafter, the inside of chamber 31 is brought by exhaust 32 to a vacuum. Upper retainer 26 is shifted in x-y-z-θ directions for aligning first semiconductor substrate 10 and second semiconductor substrate 13. Because of a vacuum state created in chamber 31, first and second semiconductor substrates 10 and 13 are bonded together at their surfaces.

Figure 8B:
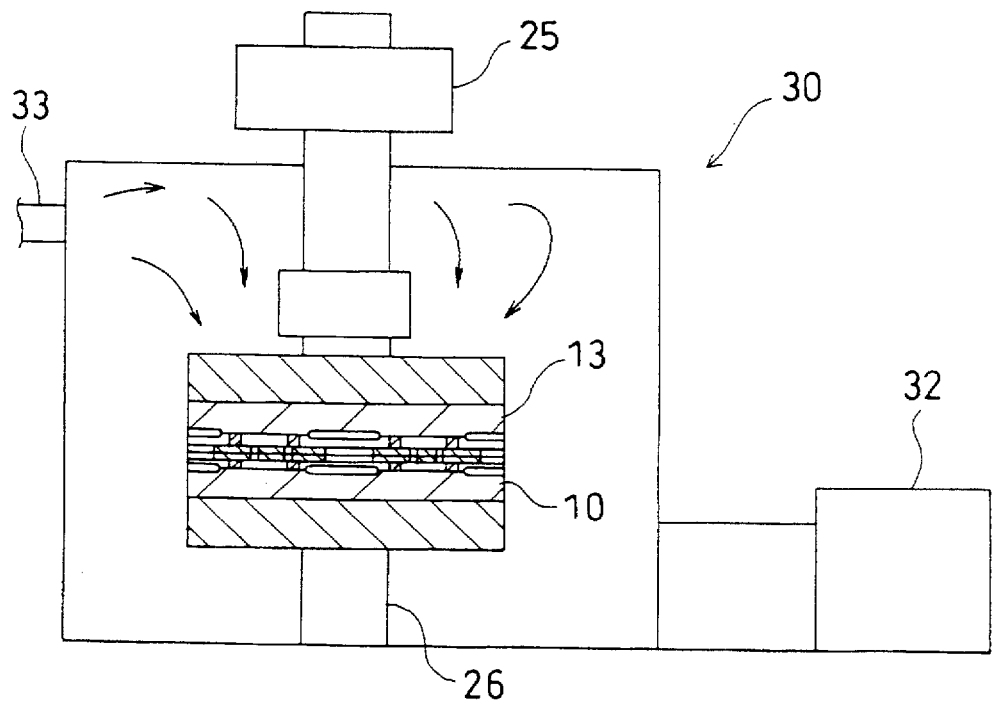

After second semiconductor substrate 13 is released from upper retainer 26 and exhaust 32 is brought to a halt, gas such as air and nitrogen is introduced into chamber 31 through gas inlet 33. This introduced gas uniformly and vertically forces second semiconductor substrate 13 downward, which is to say, towards first semiconductor substrate 10. As a result, as shown in FIG. 8(b), first and second semiconductor substrates 10 and 13 are bonded together in a vacuum atmosphere, sharing electrons.

Such a vacuum press-bonding process guarantees that first electrode 11 and second electrode 14 are bonded together. If the inside of chamber 31 is heated, this provides a much greater bonding strength.

EMBODIMENT 5

Referring now to FIGS. 9(a, b, c, d), the fabrication of a semiconductor device of the fifth embodiment is illustrated below.

Referring first to FIG. 9(a), resist layer 41 is applied onto first semiconductor substrate 10 having semiconductor elements and first interconnect line 40. Resist 41 is polished for planarization.

Next, as shown in FIG. 9(b), opening region 41a is formed in resist layer 41 by means of a photolithography process. Next, as shown in FIG. 9(c), first semiconductor substrate 10 is soaked in electroless tinning bath 42, whereupon opening region 41a of resist layer 41 is filled up with tin to form electrode 43 of connection. Electrode 43 can be formed selectively in opening region 41a since no tinning grows on resist layer 41.

As shown in FIG. 9(d), following the alignment of first semiconductor substrate 10 and second semiconductor substrate 13 that has semiconductor elements and second interconnect line 44, first and second semiconductor substrates 10 and 13 are pressed to each other while being heated. As a result, connection is established between first interconnect line 40 and second interconnect line 44 by electrode 43. In this way, the fabrication of a semiconductor device of the present embodiment is completed wherein electrode 43 is connected between first interconnect line 40 and second interconnect line 44 and wherein resist layer 41 which has become hard and which serves as an interlayer insulating film lies between first semiconductor substrate 10 and second semiconductor substrate 13.

The fifth embodiment of this invention enables electrode 43 connected between first and second interconnect lines 40 and 44 to be formed selectively. Since the strength of resist layer 41 becomes greater when it becomes hard, resist layer 41 may be used as an interlayer insulating film between semiconductor substrates. This reduces the number of bonding steps.

MODIFICATION

Referring now to FIGS. 10(a)–(d), the fabrication of a modification of the semiconductor device of the fifth embodiment is illustrated below.

Figure 10A:
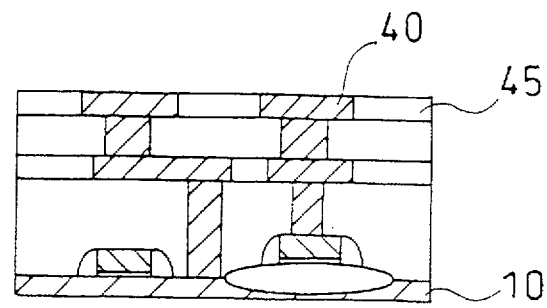
FIGS. 10(a, b, c, d) are a series of cross-sectional views which illustrate a sequence of process steps used in fabricating a semiconductor device according to a modification of the fifth embodiment of this invention.

As shown in FIG. 10(a), first insulating layer 45 of interconnection of SiN or $SiO_2$ is applied onto an entire surface of first semiconductor substrate 10 having thereon semiconductor elements and first interconnect line 40. The surface of first insulating layer 45 is polished and planarized and first interconnect line 40 is exposed. Likewise, second insulating layer 46 is applied to an entire surface of second semiconductor substrate 13 having semiconductor elements and second interconnect line 44. Second insulating layer 46 is polished and planarized and second interconnect line 44 is exposed (see FIG. 10(d)).

Figure 10B:
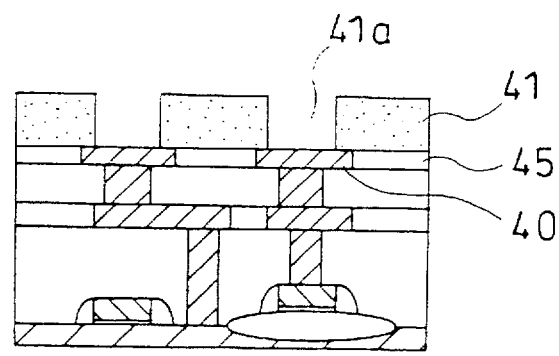
Figure 10C:
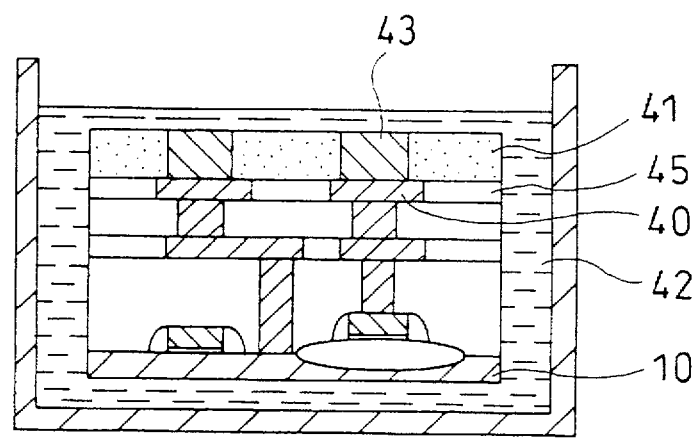

After the application of resist layer 41 to cover first semiconductor substrate 10, opening region 41a is formed in resist layer 41 by means of a photolithography process (see FIG. 10(b)). Next, as shown in FIG. 10(c), first semiconductor substrate 10 is soaked in electroless tinning bath 42, so that opening region 41a of resist layer 41 is filled up with tin to form electrode 43 of connection.

Figure 10D:
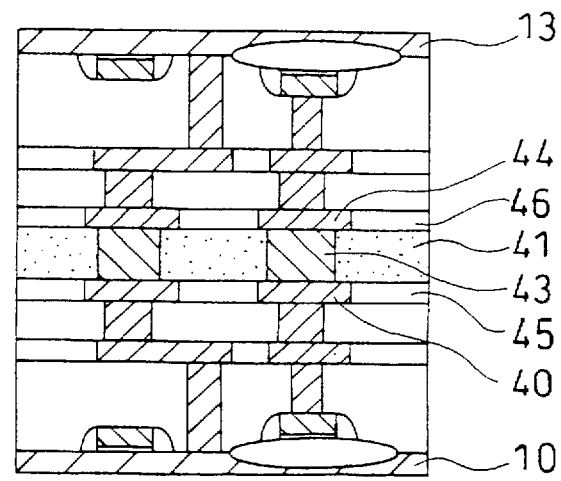

Next, as shown in FIG. 10(d), after aligning first semiconductor substrate 10 and second semiconductor substrate 13, first and second semiconductor substrates 10 and 13 are press bonded together while being heated. As a result, connection is established between first interconnect line 40 and second interconnect line 44 by electrode 43. In this way, the fabrication of a semiconductor device of the present modification is completed wherein electrode 43 is connected between first and second interconnect lines 40 and 44 and wherein resist layer 41 which has become hard and which serves as an interlayer insulating film lies between first and second semiconductor substrates 10 and 13.

The present modification of the fifth embodiment enables electrode 43 connected between first and second interconnect lines 40 and 44 to be formed selectively. Since the strength of resist layer 41 becomes greater when it becomes hard, resist layer 41 may be used as an interlayer insulating film between semiconductor substrates. This reduces the number of bonding steps. Because the surfaces of semiconductor substrates 10 and 13 are planarized, this provides a greater contact area between first semiconductor substrate 10 and second semiconductor substrate 13, whereupon they are bonded together at a greater bonding strength.

EMBODIMENT 6

Figure 11A:
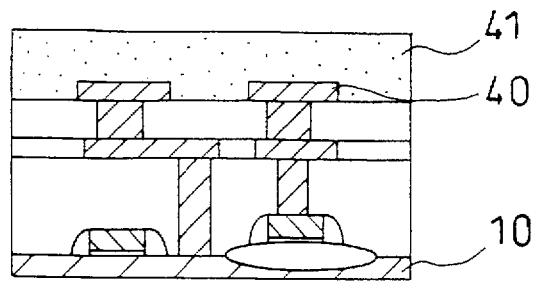
FIGS. 11(a, b, c) through 12(a, b) are a series of cross-sectional views which illustrate a sequence of process steps used in fabricating a semiconductor device according to a sixth embodiment of this invention.
Figure 11B:
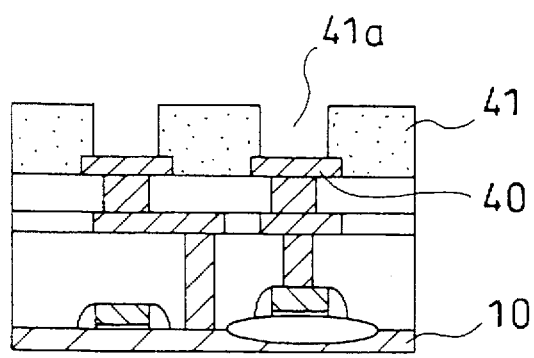

Referring now to FIGS. 11(a, b, c) and FIGS. 12(a, b), the fabrication of a semiconductor device of the sixth embodiment is illustrated below.

First, as shown in FIG. 11(a), resist layer 41 is applied onto an entire surface of first semiconductor substrate 10 having semiconductor elements and first interconnect line 40. Resist layer 41 is polished for planarization. Opening region 41a is formed in resist layer 41 by means of a photolithography process. Resist layer 48 is applied onto an entire surface of second semiconductor substrate 13 having semiconductor elements and second interconnect line 44. Resist layer 48 is polished for planarization. Opening region 48a is formed in resist layer 48 by means of a photolithography process (see FIG. 11(c)).

Figure 11C:
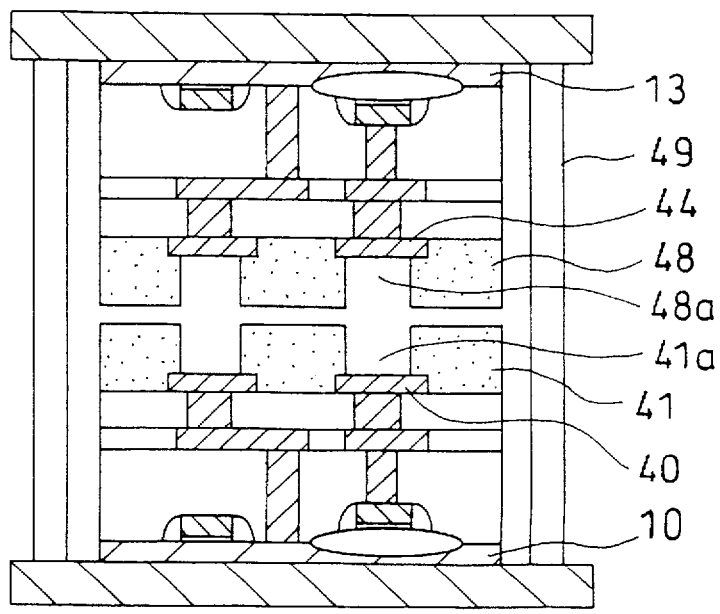

As shown in FIG. 11(c), first semiconductor substrate 10 and second semiconductor substrate 13 are aligned with each other, with opening region 41a and opening region 48a facing each other and with a space defined between first interconnect line 40 and second interconnect line 44. Thereafter, both first semiconductor substrate 10 and second semiconductor substrate 13 are held by jig 49.

As shown in FIG. 12(a), first semiconductor substrate 10 and second semiconductor substrate 13 which are held by the jig 49 are soaked in electroless tinning bath 42, whereupon opening region 41a of resist layer 41 and opening 48a of resist layer 48 are filled up with tin to form electrode 43 for establishing a connection between first interconnect line 40 and second interconnect line 44. In this case, tinning grows, only on first and second interconnect lines 40 and 44, in other words no tinning grows on any of resist layers 41 and 48. This enables the selective formation of electrode 43 in opening regions 41a and 48a.

Referring to FIG. 12(b), after insulating resin 50, e.g., polyimide, is filled between first semiconductor substrate 10 and second semiconductor substrate 13, these substrates are pressed to each other while being heated. In this way, first and second semiconductor substrates 10 and 13 are bonded together.

The sixth embodiment enables electrode 43 to be formed selectively. Additionally, in the sixth embodiment, resist layers 41 and 48 which become stronger when they become hard can be used as interlayer insulating films between first and second semiconductor substrates 10 and 13. This reduces the number of bonding steps. Further, electrode 43 for connecting first and second interconnect lines 40 and 44 is formed in electroless plating bath 42. This can provide a less contaminated contact surface, therefore enhancing the reliability of electrical interconnection as well as the degree of interconnection strength.

MODIFICATION

Referring now to FIGS. 13(a, b, c) and FIG. 14(a, b), the fabrication of a modification of the semiconductor device according to the sixth embodiment is illustrated below.

Figure 13A:
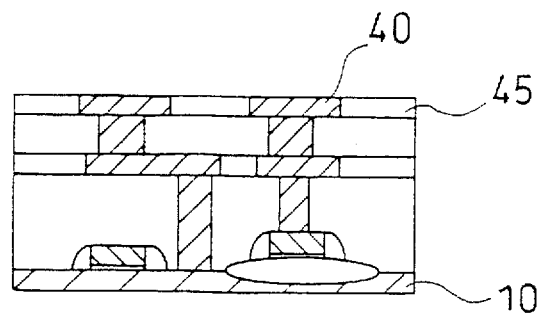
FIGS. 13(a, b, c) through 14(a, b) are a series of cross-sectional views which illustrate a sequence of process steps used in fabricating a semiconductor device according to a modification of the sixth embodiment of this invention.
Figure 13B:
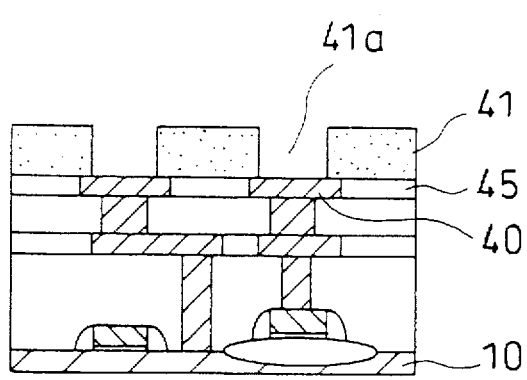

As shown in FIG. 13(a), first insulating layer 45 of interconnection of SiN or $SiO_2$ is applied to cover an entire surface of first semiconductor substrate 10 having thereon semiconductor elements and first interconnect line 40. First insulating layer 45 is polished and planarized, and first interconnect line 40 is exposed. First resist layer 41 is applied onto first semiconductor substrate 10. Opening region 41a is formed in resist 41 by mean of a photolithography process (see FIG. 13(b)). Likewise, second insulating layer 46 of interconnection is applied to cover an entire surface of second semiconductor substrate 13 having semiconductor elements and second interconnect line 44. Second insulating layer 46 is polished and planarized, and second interconnect line 44 is exposed. Second resist layer 48 is applied onto an entire surface of second semiconductor substrate 13, and opening region 48a is formed in second resist layer 48 by means of a photolithography process (see FIG. 13(c)).

Figure 13C:
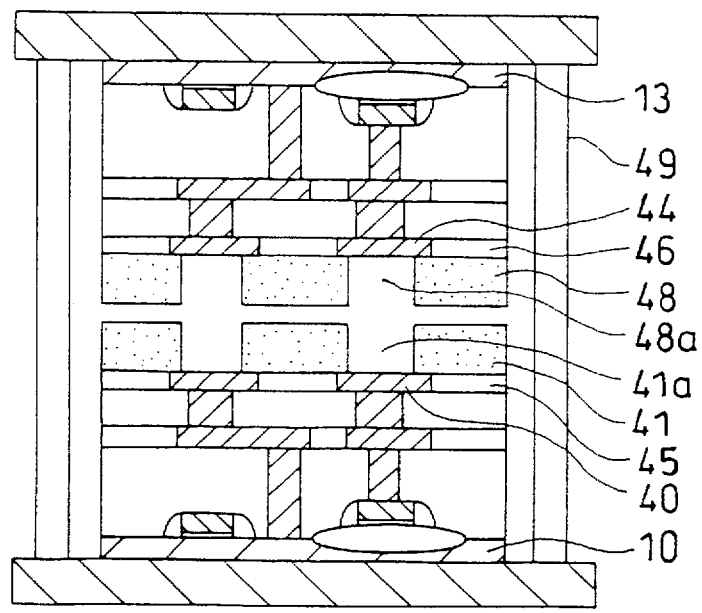

As shown in FIG. 13(c), an alignment step of aligning first and second semiconductor substrates 10 and 13 is performed with opening region 41a and opening region 48a facing each other and with a space between first and second interconnect lines 40 and 44. Thereafter, both first semiconductor substrate 10 and second semiconductor substrate 13 are held by jig 49.

Figure 14A:
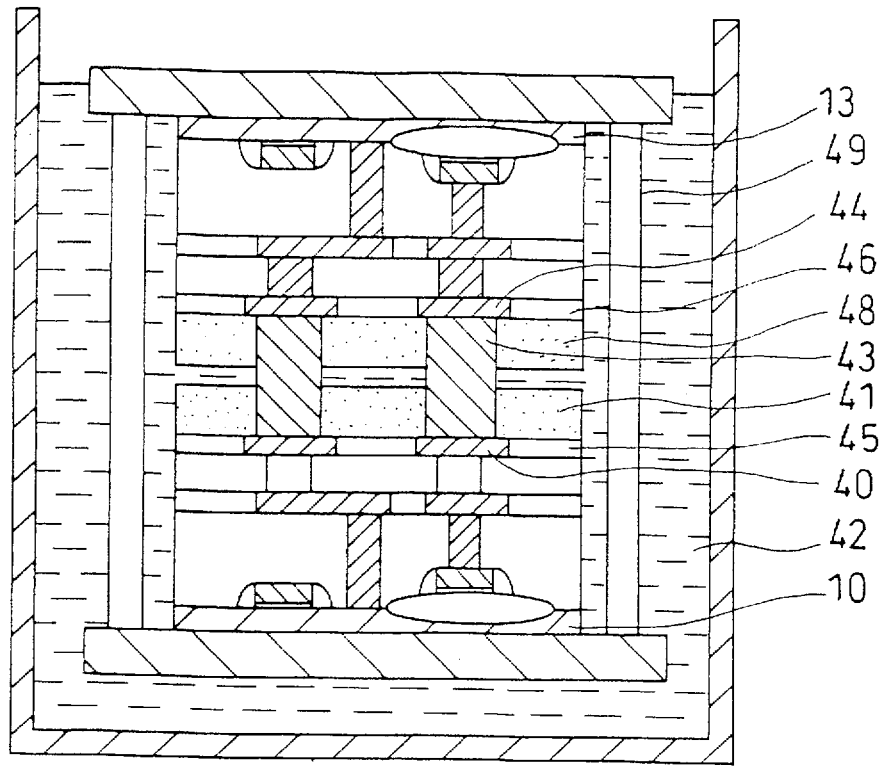

As shown in FIG. 14(a), first semiconductor substrate 10 and second semiconductor substrate 13 held by jig 49 are soaked in electroless tinning bath 42, whereupon opening region 41a of first resist layer 41 and opening region 48a of second resist layer 48 are filled with tin to form electrode 43 for establishing a connection between first and second interconnect lines 40 and 44. In this case, tinning grows, only on first and second interconnect lines 40 and 44, in other words no tinning grows on any of first and second resist layers 41 and 48. This enables the selective formation of electrode 43 in opening regions 41a and 48a.

Figure 14B:
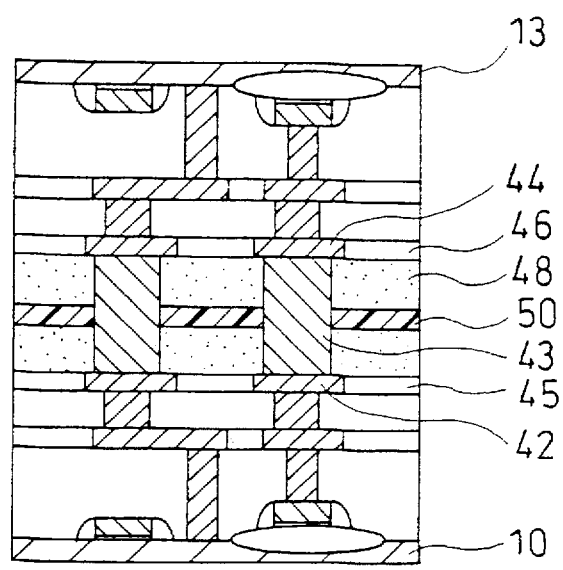

Referring to FIG. 14(b), after insulating resin 50 is filled between first semiconductor substrate 10 and second semiconductor substrate 13, these substrates are pressed to each other while being heated. In this way, first semiconductor substrate 10 and second semiconductor substrate 13 are bonded together.

The present modification enables the selective formation of electrode 43. Additionally, the present modification enables resist layers 41 and 48 whose strengths become higher when they become hard to act as interlayer insulating films between first and second semiconductor substrates 10 and 13. This reduces the number of bonding steps. Because of planarization of the surfaces of first and second semiconductor substrates 10 and 13, the contact area of first semiconductor substrate 10 and second semiconductor substrate 13 increases whereupon they are bonded together at a greater bonding strength. Further, electrode 43 is formed in electroless plating bath 42. This can provide a less contaminated contact surface, therefore enhancing the reliability of electrical interconnection as well as the degree of interconnection strength.

EMBODIMENT 7

Referring now to FIGS. 15(a, b, c) and FIGS. 16(a, b), the fabrication of a semiconductor device according to the seventh embodiment of this invention is illustrated below.

Figure 15A:
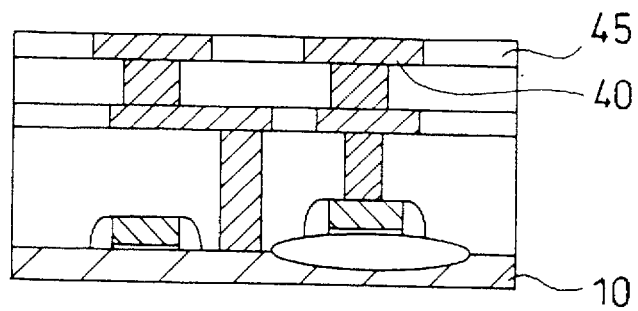
FIGS. 15(a, b, c) through 16(a, b) are a series of cross-sectional views which illustrate a sequence of process steps used in fabricating a semiconductor device according to a seventh embodiment of this invention.

As shown in FIG. 15(a), first insulating layer 45 of interconnection of SiN or $SiO_2$ is applied onto an entire surface of first semiconductor substrate 10 having semiconductor elements and first interconnect line 40. First insulating layer 45 is polished and planarized, and first interconnect line 40 is exposed. Likewise, second insulating layer 46 is applied onto an entire surface of second semiconductor substrate 13 having semiconductor elements and second interconnect line 44. Second insulating layer 46 is polished and planarized, and second interconnect line 44 is exposed (see FIG. 16(b)).

Figure 15B:
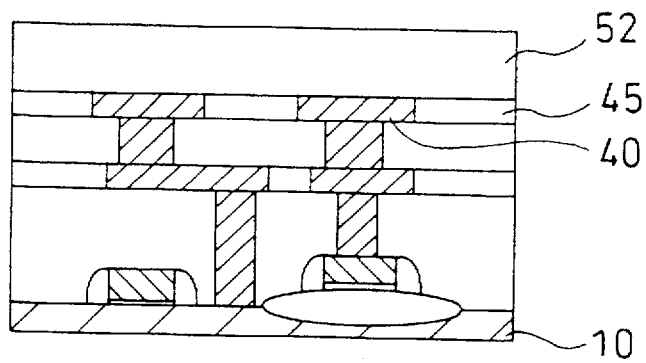
Figure 15C:
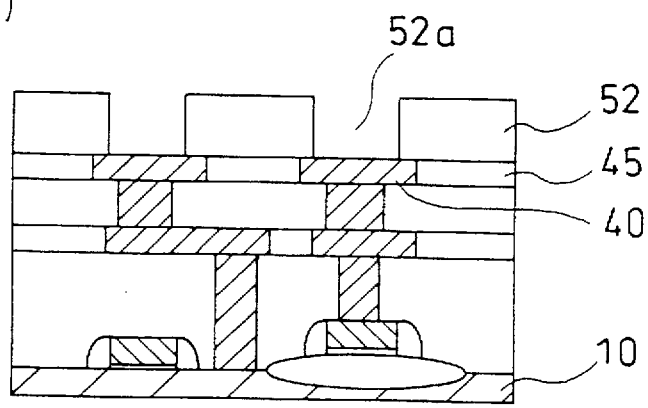

Next, following the deposition of interlayer insulating film 52 of silicon oxide on first semiconductor substrate 10 by means of a CVD process (see FIG. 15(b)), a photolithography process and a dry etching process are carried out to form opening region 52a in interlayer insulating film 52 (see FIG. 15(c)).

Figure 16A:
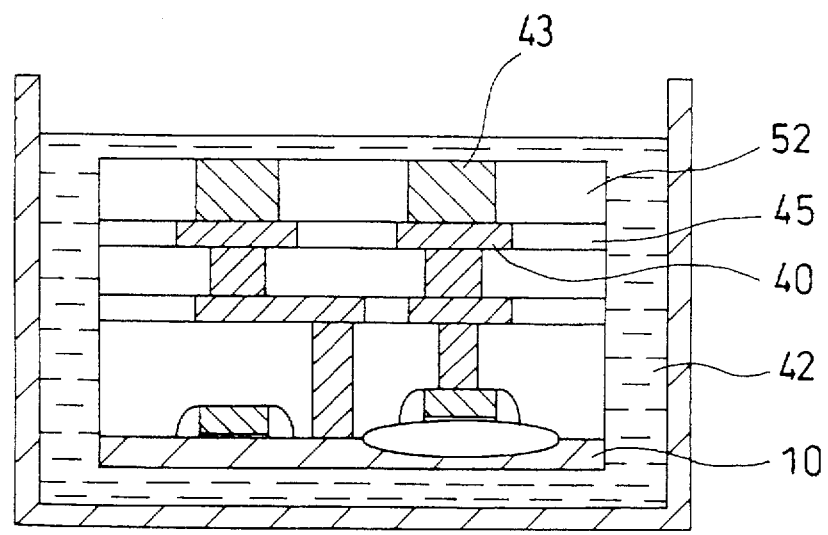

Next, as shown in FIG. 16(a), first semiconductor substrate 10 is soaked in electroless tinning bath 42, whereupon opening region 52a of interlayer insulating film 52 is filled with tin to form electrode 53. In this case, no tinning grows on interlayer insulating film 52 and therefore electrode 43 can be formed selectively in opening region 52a of interlayer insulating film 52.

Figure 16B:
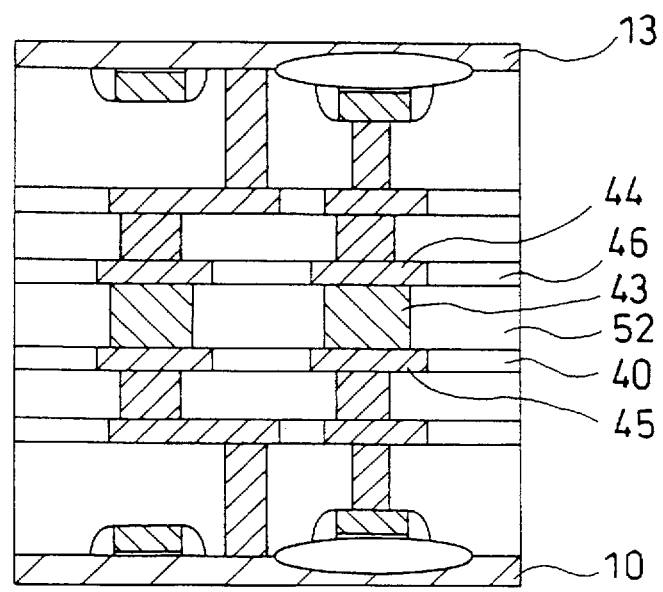

As shown in FIG. 16(b), after the alignment of first semiconductor substrate 10 with second semiconductor substrate 13, first and second semiconductor substrates 10 and 13 are press bonded together while being heated. As a result, a connection is established between first and second interconnect lines 40 and 44 by electrode 43. In this way, the fabrication of a semiconductor device of the present embodiment is completed wherein electrode 43 is connected between first and second interconnect lines 40 and 44 and wherein interlayer insulating film 52 is sandwiched between first and second semiconductor substrates 10 and 13.

The seventh embodiment enables the selective formation of electrode 43 for connecting first; interconnect line 40 and second interconnect line 44. Additionally, interlayer insulating film 52, formed by silicon oxide having a good thermal strength as well as a good mechanical strength, is provided between the substrates. This prevents electrode 43 from being stressed by dielectric shrinkage due to heat applied when connecting first interconnect line 40 and second interconnect line 44. This improves the reliability of electrical interconnection.

In the seventh embodiment, an electroless plating process is used. However, a selective CVD process may be used in which tungsten is embedded in opening region 52a of interlayer insulating film 52 to form an electrode 43 and the selection range of material for electrode 43 becomes extensive. In the seventh embodiment, interlayer insulating film 52 is formed of silicon oxide. If, however, a material having a low dielectric constant is used instead, this reduces the time of delay in first and second interconnect lines 40 and 44.

MODIFICATION

Referring now to FIGS. 17(a, b, c, d) and FIGS. 18(a, b), the fabrication of a modification of the semiconductor device of the seventh embodiment is illustrated below.

Figure 17A:
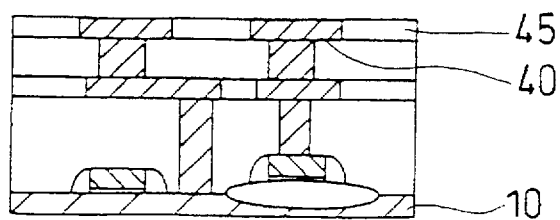
FIGS. 17(a, b, c, d) through 18(a, b) are a series of cross-sectional views which illustrate a sequence of process steps used in fabricating a semiconductor device according to a modification of the seventh embodiment of this invention.
Figure 17B:
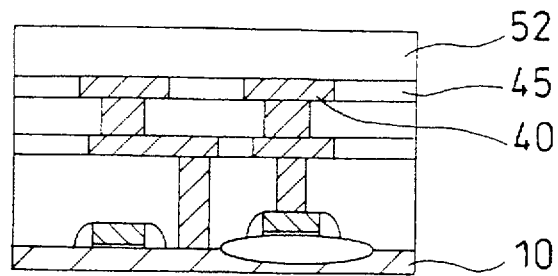
Figure 17C:
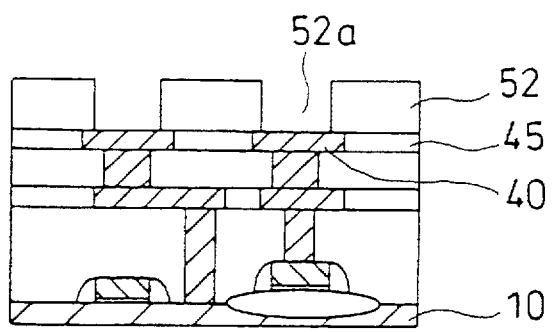

As shown in FIG. 17(a), first insulating layer 45 of interconnection is applied onto an entire surface of first semiconductor substrate 10 having semiconductor elements and first interconnect line 40. First insulating layer 45 is polished and planarized, and first interconnect line 40 is exposed. First interlayer insulating film 52, which is a CVD silicon oxide layer, is deposited on first semiconductor substrate 10 (see FIG. 17(b)). Opening region 52a is formed in first interlayer insulating film 52 by means of a photolithography process and by means of a dry etching process (see FIG. 17(c)). Likewise, second insulating layer 46 of interconnection is applied onto an entire surface of second semiconductor substrate 13 having semiconductor elements and second interconnect line 44. Second insulating layer 46 is polished and planarized, and second interconnect line 44 is exposed. Second interlayer insulating film 53, which is a CVD silicon oxide layer, is deposited on second semiconductor substrate 13. Opening region 53a is formed in second interlayer insulating film 53 by means of a photolithography process and by means of a dry etching process (see FIG. 17(d)).

Figure 17D:
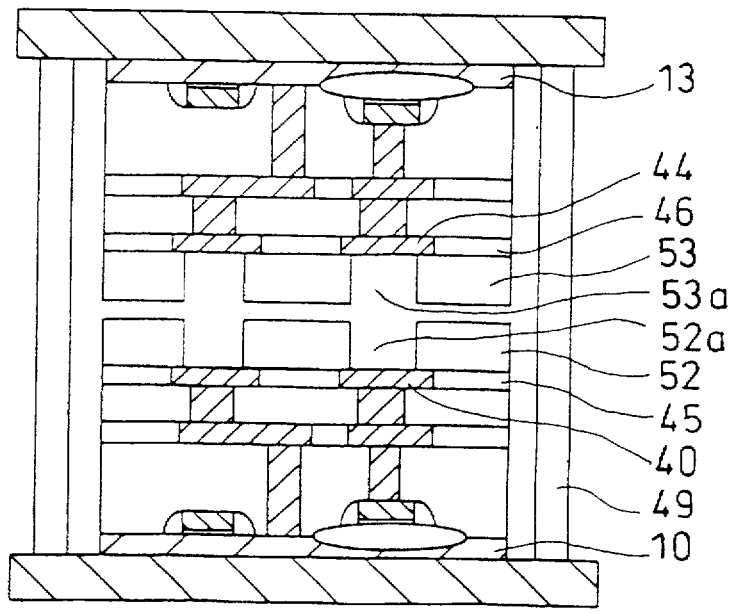

As shown in FIG. 17(d), first and second semiconductor substrates 10 and 13 are aligned with each other, with opening region 52a and opening region 53a facing each other and with a space between first interconnect line 40 and second interconnect line 44. Thereafter, first and second semiconductor substrates 10 and 13 are held by jig 49.

Figure 18A:
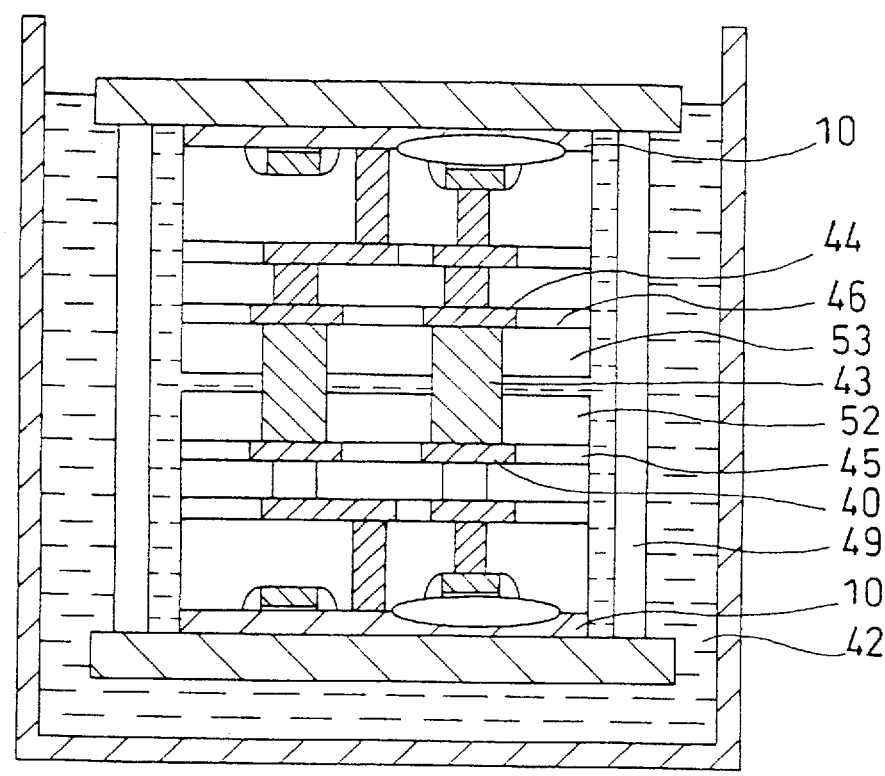

As shown in FIG. 18(a), first semiconductor substrate 10 and second semiconductor substrate 13 held by jig 49 are soaked in electroless tinning bath 42, so that opening region 52a and opening region 53a are filled with tin to form electrode 43 for establishing a connection between first interconnect line 40 and second interconnect line 44. In this case, tinning grows only on first and second interconnect lines 40 and 44, in other words no tinning grows on any of first and second interlayer insulating films 52 and 53. This enables the selective formation of electrode 43 in opening regions 52a and 53a.

Figure 18B:
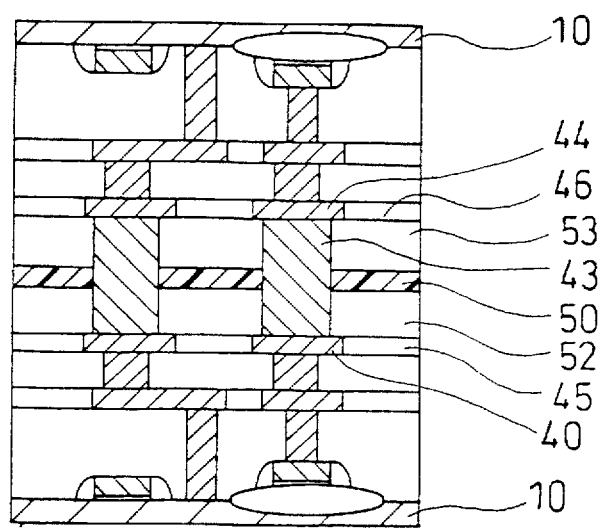

Referring to FIG. 18(b), after insulating resin 50 is filled between first semiconductor substrate 10 and second semiconductor substrate 13, these substrates are pressed to each other while being heated. In this way, first semiconductor substrate 10 and second semiconductor substrate 13 are bonded together.

Electrode 43 for connecting first interconnect line 40 and second interconnect line 44 is formed in electroless tinning bath 42. This can provide a less contaminated contact surface, therefore enhancing the reliability of electrical interconnection as well as the degree of interconnection strength.

EMBODIMENT 8

Referring now to FIGS. 19(a, b, c, d), the fabrication of a semiconductor device of the eighth embodiment of this invention is illustrated below.

Figure 19A:
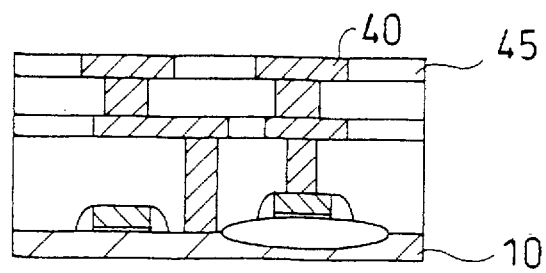
FIGS. 19(a, b, c, d) are a series of cross-sectional views which illustrate a sequence of process steps used in fabricating a semiconductor device according to an eighth embodiment of this invention.
Figure 19B:
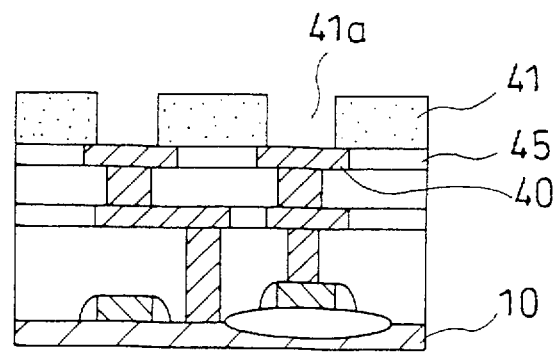

As shown in FIG. 19(a), first insulating layer 45 of interconnection is applied onto an entire surface of first semiconductor substrate 10 having semiconductor elements and first interconnect line 40. First insulating layer 45 is polished and planarized, and first interconnect line 40 is exposed. First resist layer 41 is applied onto first semiconductor substrate 10. A photolithography process is performed to form opening region 41a in first resist layer 41 (see FIG. 19(b)). Likewise, second insulating layer 46 of interconnection is formed on an entire surface of second semiconductor substrate 13 having semiconductor elements and second interconnect line 44. Second insulating layer 46 is polished and planarized, and second interconnect line 44 is exposed. Second resist layer 48 is applied onto second semiconductor substrate 13. A photolithography process is performed to form opening region 48a in second resist layer 48 (see FIG. 19(d)).

Figure 19C:
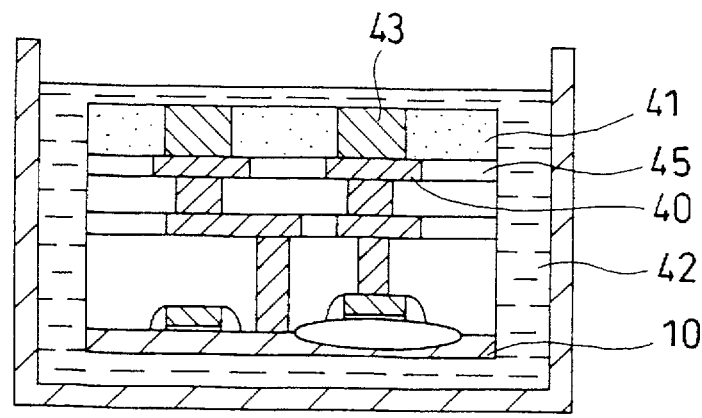

As shown in FIG. 19(c), first semiconductor substrate 10 is soaked in electroless tinning bath 42, so that opening region 41a is filled with tin to form first electrode 43. Likewise, second semiconductor substrate 13 is soaked in electroless tinning bath 42, so that opening region 48a is filled with tin to form second electrode 55 (see FIG. 19(d)).

Figure 19D:
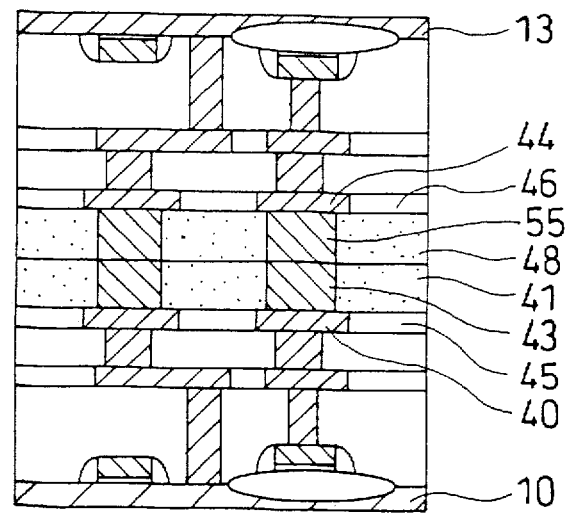

Referring now to FIG. 19(d), following the alignment of first semiconductor substrate 10 and second semiconductor substrate 13, first and second semiconductor substrates 10 and 13 are pressed to each other while being heated. In this way, semiconductor substrates 10 and 13 are bonded together. As a result, connection between first interconnect line 40 and second interconnect line 44 is established by first and second electrodes 43 and 55, and an insulating layer composed of first and second resist layers 41 and 48 which have become hard is sandwiched between first and second semiconductor substrates 10 and 13.

As described above, first electrode 43 is formed independent of the formation of second electrode 55. This means less processing waiting time. Opening regions 41a and 48a are filled with first and second electrodes 43 and 55 without voids. Additionally, first and second resist layers 41 and 48 form a combined insulating layer therefore having a great film thickness, which achieves a reduction in the interconnection resistance and a reduction in the interconnect line delay time.

In the present embodiment, first and second resist layers 41 and 48 which has become hard are used as an insulating layer between first and second semiconductor substrates 10 and 13. However, different types of dielectric, e.g., silicon oxide, may be used.

EMBODIMENT 9

Referring now to FIGS. 20(a, b, c, d), the fabrication of a semiconductor device of the ninth embodiment of this invention is illustrated below.

As shown in FIG. 20(a), first insulating layer 45 of interconnection is applied onto an entire surface of first semiconductor substrate 10 having semiconductor elements and first interconnect line 40. First insulating layer 45 is polished and planarized, and first interconnect line 40 is exposed. First resist layer 41 is applied onto first semiconductor substrate 10. A photolithography process is performed to form opening region 41a in first resist layer 41 (see FIG. 20(b)). Likewise, second insulating layer 46 of interconnection is formed on second semiconductor substrate 13 having semiconductor elements and second interconnect line 44. Second insulating layer 46 is polished and planarized, and second interconnect line 44 is exposed. Second resist layer 48 is applied onto second semiconductor substrate 13. A photolithography process is performed to form opening region 48a in second resist layer 48 (see FIG. 20(d)).

Referring now to FIG. 20(b), first semiconductor substrate 10 is placed on heating plate 20 and is heated at about 300 degrees centigrade in an inert gas atmosphere, whereupon first resist layer 41 becomes hard.

Next, as shown in FIG. 20(c), first semiconductor substrate 10 is soaked in electroless tinning bath 42, whereupon tin is embedded in opening region 41a of first resist layer 41 to form electrode 43.

Referring now to FIG. 20(d), following the alignment of first semiconductor substrate 10 with second semiconductor substrate 13, first and second semiconductor substrates 10 and 13 are press bonded together while being heated, as a result of which connection between first interconnect line 40 and second interconnect line 44 is established by electrode 43, and an insulating layer composed of resist layer 41 which is brought into a thermoset and which therefore has an enhanced strength lies between first and second semiconductor substrates 10 and 13.

In the present embodiment, prior to the formation of electrode 43 by means of an electroless plating process, resist layer 41 is heated and is brought into a thermoset. This arrangement prevents resist layer 41 from absorbing moisture in electroless tinning bath 42 and prevents resist layer 41 from suffering a shrinkage due to heat application and press bonding, therefore preventing electrode 43 from suffering corrosion and preventing the occurrence of electrode delamination due to stress caused by shrinkage.

EMBODIMENT 10

Referring now to FIGS. 21(a, b, c) and FIGS. 22(a, b, c), the fabrication of a semiconductor device of the tenth embodiment of this invention is illustrated below.

Figure 21A:
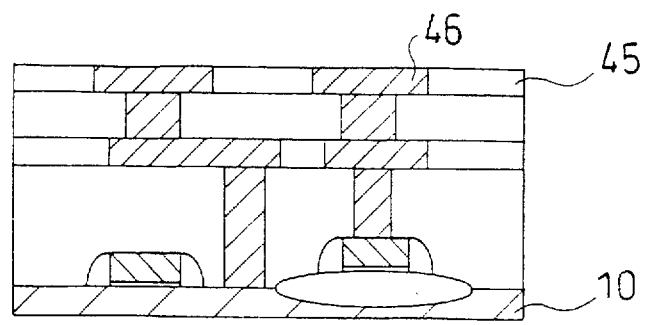
FIGS. 21(a, b, c) through 22(a, b, c) are a series of cross-sectional views which illustrate a sequence of process steps used in fabricating a semiconductor device according to a tenth embodiment of this invention.
Figure 22:
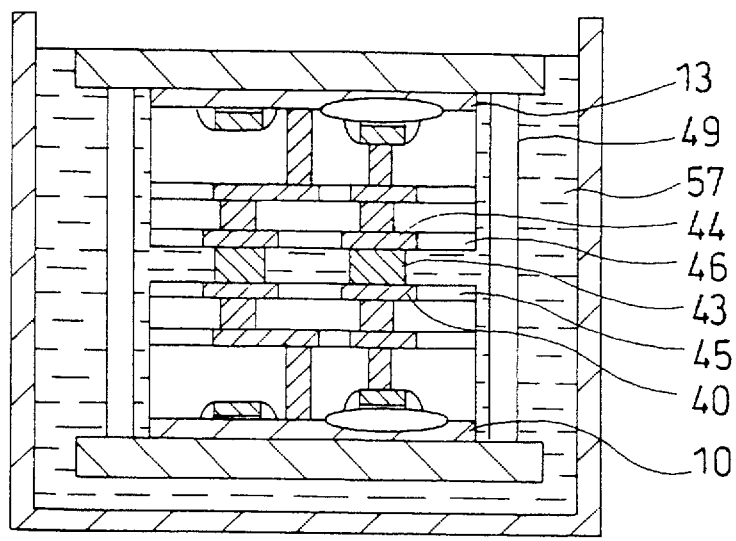
Figure 22:
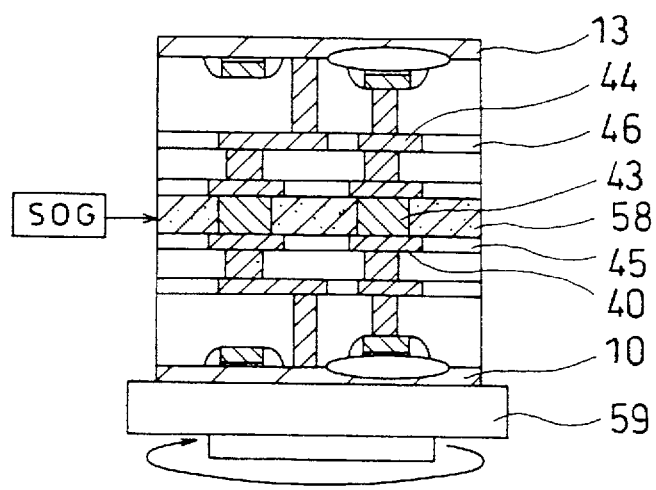
Figure 22:
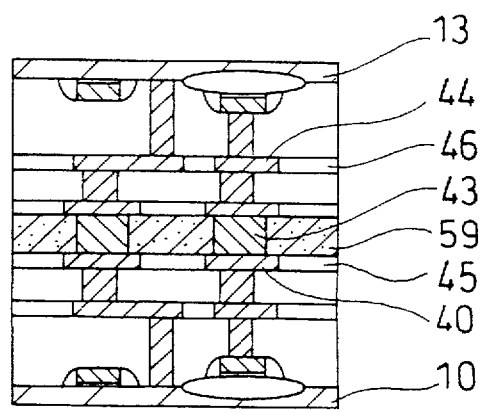

As shown in FIG. 21(a), first insulating layer 45 of interconnection is applied onto an entire surface of first semiconductor substrate 10 having semiconductor elements and first interconnect line 40. First insulating layer 45 is polished and planarized, and first interconnect line 40 is exposed. Likewise, second insulating layer 46 of interconnection is applied onto an entire surface of second semiconductor substrate 13 having semiconductor elements and second interconnect line 44. Second insulating layer 46 is polished and planarized, and interconnect line 44 is exposed. Resist layer 41 is applied onto first semiconductor substrate 10. A photolithography process is performed to form opening region 41a in resist layer 41.

Figure 21B:
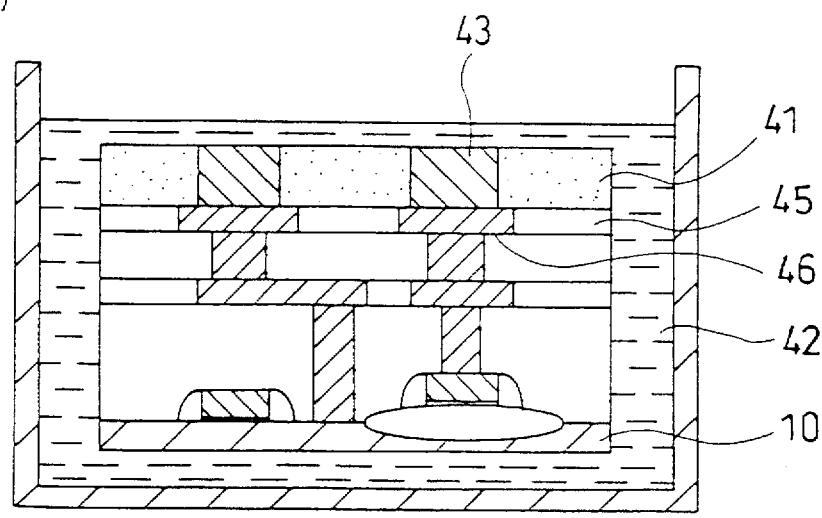

Next, as shown in FIG. 21(b), first semiconductor substrate 10 is soaked in electroless tinning bath 42, whereupon tin is embedded in opening region 41a to form electrode 43 of connection.

Figure 21C:
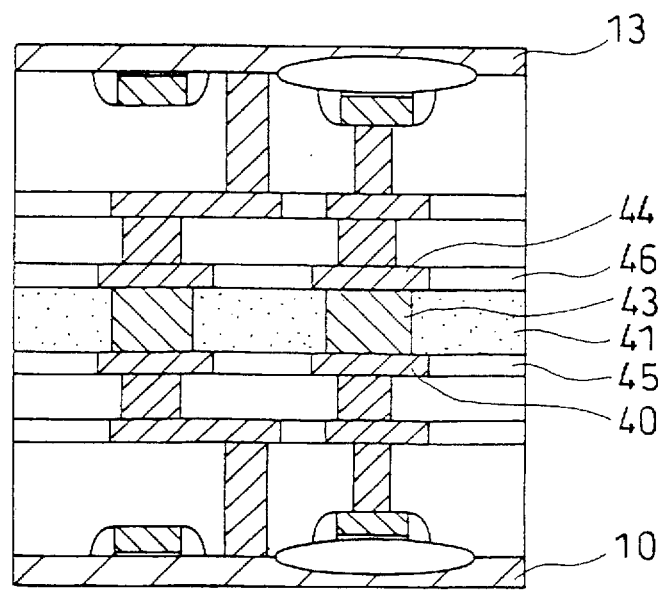

As shown in FIG. 21(c), following the alignment of first second semiconductor substrate 10 with second semiconductor substrate 13, first and second semiconductor substrates 10 and 13 are pressed to each other while being heated. As a result, first interconnect line 40 and second interconnect line 44 are connected together via electrode 43.

Next, as shown in FIG. 22(a), first and second semiconductor substrates 10 and 13 which are bonded together are held by jig 49 are soaked in organic solvent 57 for the removal of resist layer 41.

Next, SOG (spin-on-glass) 58 is applied between first and second semiconductor substrates 10 and 13, and SOG 58 is spread by spinner 59 to be uniform in thickness. Thereafter, SOG 58 is subjected to an annealing process and is brought into a thermoset. In this way, SOG layer 59 is formed between first and second semiconductor substrates 10 and 13.

In the tenth embodiment, following the removal of resist layer 41 from between first and second semiconductor substrates 10 and 13, SOG layer 59 is formed between first and second semiconductor substrates 10 and 13. This not only increases the strength of an insulating layer between first and second semiconductor substrates 10 and 13 but also controls the dielectric constant. Additionally, it is arranged such that resist layer 41 is removed after first and second interconnect lines 40 and 44 are connected together via electrode 43. Such an arrangement prevents delamination from occurring at bonding portions where first and second interconnect lines 40, 44 and electrode 43 are connected.

EMBODIMENT 11

Referring now to FIGS. 23(a, b, c, d), 24(a, b), 25(a, b), the fabrication of a semiconductor device of the eleventh embodiment of this invention is illustrated below.

Figure 23A:
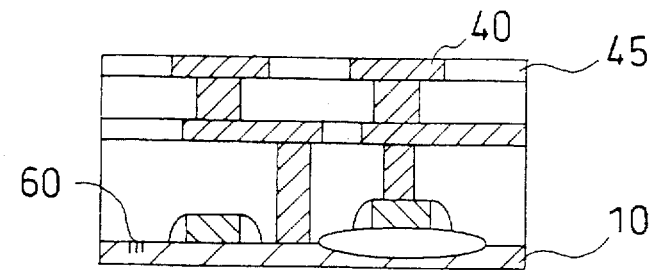
FIGS. 23(a, b, c, d), 24(a, b), and 25(a, b) are a series of cross-sectional views which illustrate a sequence of process steps used in fabricating a semiconductor device according to an eleventh embodiment of this invention.
Figure 23B:
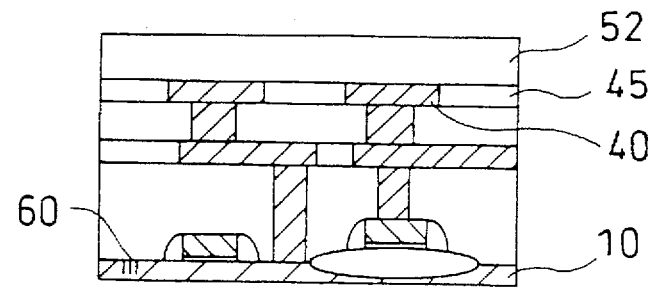
Figure 23C:
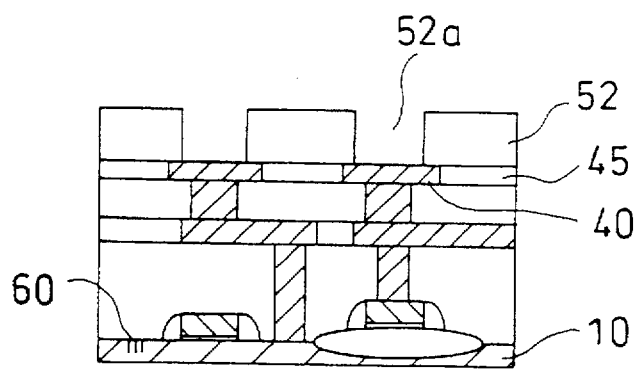
Figure 24A:
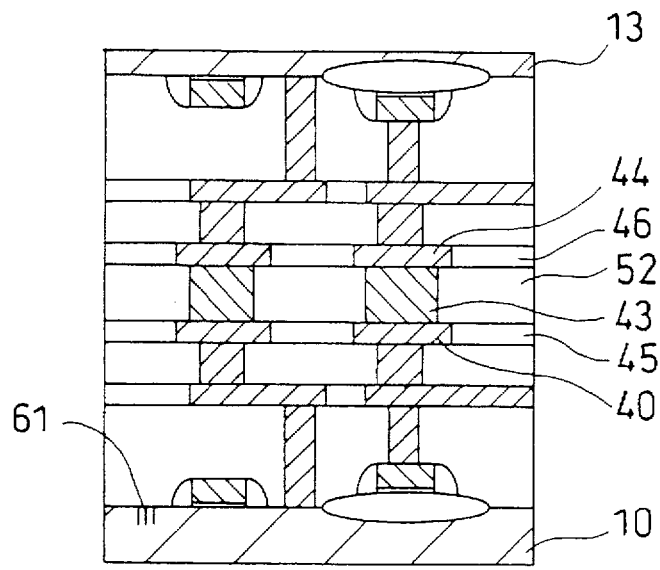

Referring first to FIG. 23(a), first insulating layer 45 of interconnection is applied onto a principal surface of first semiconductor substrate 10 which is transparent and which has thereon alignment mark 60, semiconductor elements, first interconnect line 40, and conductive layer 61. First insulating layer 45 is polished and planarized, and first interconnect line 40 is exposed. Likewise, second insulating layer 46 is formed on a principal surface of second semiconductor substrate 13 which has thereon semiconductor elements and second interconnect line 44. Second insulating layer 46 is polished and planarized, and second interconnect line 44 is exposed (see FIG. 24(a)). After the application of interlayer insulating film 52 of silicon oxide on first semiconductor substrate 10 by means of a CVD process, opening region 52a is formed in interlayer insulating film 52 by means of a photolithography process and by means of a dry etching process (see FIG. 23(c)).

Figure 23D:
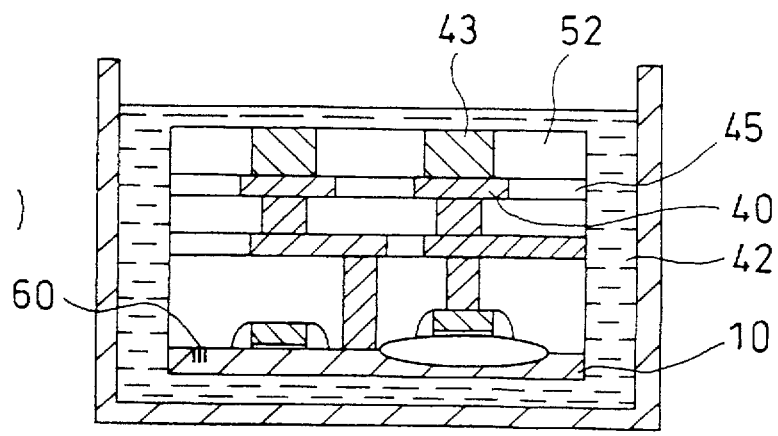

Next, as shown in FIG. 23(d), first semiconductor substrate 10 is soaked in electroless tinning bath 42, whereupon tin is embedded in opening region 52a to form electrode 43 of connection.

As shown in FIG. 24(c), after the alignment of first semiconductor substrate 10 with second semiconductor substrate 13, first and second semiconductor substrates 10 and 13 are pressed to each other while being heated. As a result, connection is established between first interconnect line 40 and second interconnect line 44 by electrode 43.

Figure 24B:
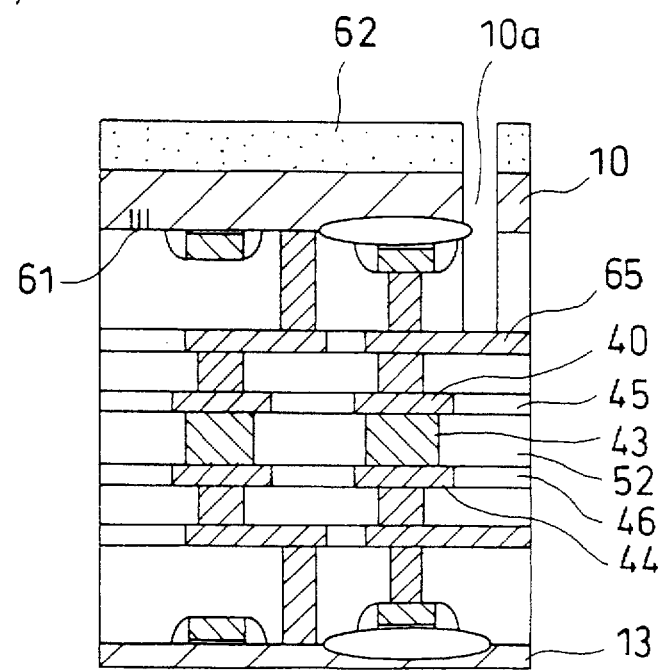

As shown upside down in FIG. 24(b), resist pattern 62 is formed on a surface of semiconductor substrate 10 opposite to the principal surface thereof by means of a photolithography process. More specifically, when performing such a photolithography process, the alignment of resist pattern 62 is performed with the aid of alignment mark 60. Thereafter, using resist pattern 62 as an etch mask, a dry etching process is carried out on first semiconductor substrate 10 so as to form opening region 10a in first semiconductor substrate 10 extending to conductive layer 61.

Figure 25A:
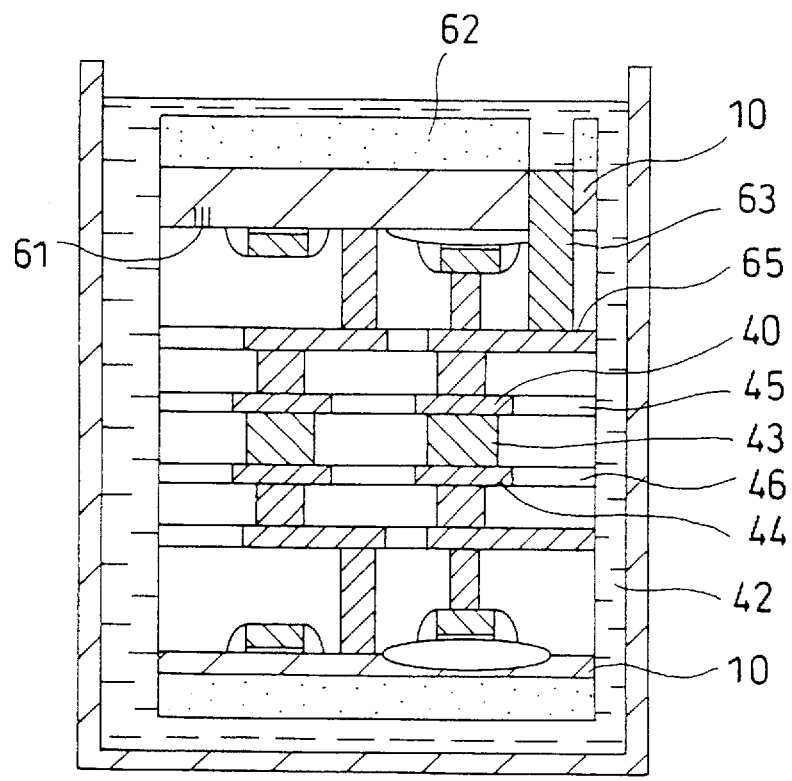

Next, as shown in FIG. 25(a), first and second semiconductor substrates 10 and 13 which are bonded together are soaked in electroless tinning bath 42, whereupon opening region 10a of first semiconductor substrate 10 is filled up with tin to form extraction electrode 63 to be associated with conductive layer 61.

Figure 25B:
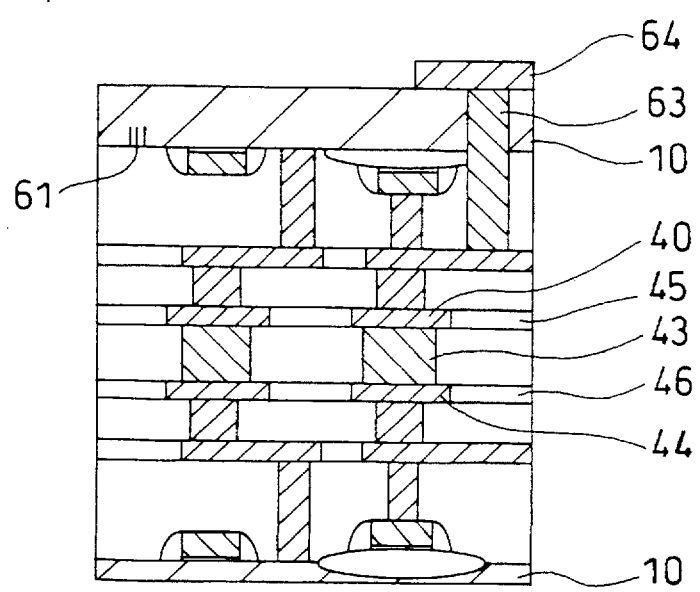

Next, as shown in FIG. 25(b), following the deposition of a layer of aluminum on the surface of semiconductor substrate 10 opposite to the principal surface thereof by means of a spatter process, the aluminum layer is dry etched using a photoresist to form terminal 64 for providing connection with an external electrode.

In accordance with the eleventh embodiment, terminal 64 can be formed on the surface of first semiconductor substrate 10 opposite to the principal surface thereof, so that the establishment of connection to an external electrode can be accomplished easily. Multifunctional semiconductor devices formed by bonding semiconductor substrates are obtained, and the density of packaging can be increased easily.

Although in the present embodiment extraction electrode 63 is formed by means of an electroless tinning technique, other techniques such as a selective CVD technique may be used.

EMBODIMENT 12

Referring now to FIGS. 26(a, b, c, d), the fabrication of a semiconductor device of the twelfth embodiment of this invention is illustrated below.

As shown in FIG. 26(a), a plasm CVD process is performed to deposit first interlayer insulating film 52 of silicon nitride on an entire surface of first semiconductor substrate 10 which has thereon alignment mark 60, semiconductor elements, and first interconnect line 40. Thereafter, with a photoresist, an etching process is carried out to form opening region 52a above first interconnect line 40 of first interlayer insulating film 52 (see FIG. 26(b)).

Next, a TiN/Ti layer is deposited on the entire surface by means of a spatter process. A layer of tungsten is deposited by means of a CVD process having a film thickness thick enough to fill up opening region 52a. The TiN/Ti layer and the tungsten layer are polished by means of a chemical mechanical polish (CMP) process, whereupon as shown in FIG. 26(c) electrode 43 of connection is formed in opening region 52a of first interlayer insulating film 52, and first metallic layer 65 of bonding is formed in a recess in first interlayer insulating film 52.

Second interlayer insulating film 53 is formed on second semiconductor substrate 13 having thereon alignment mark 60, semiconductor elements, and second interconnect line 44. A photolithography process and an etching process are performed to form opening region 53a above second interconnect line 44 of second interlayer insulating film 53. Next, a TiN/Ti layer is deposited by means of a spatter process, and a layer of tungsten is deposited by means of a CVD process having a film thickness thick enough to fill up opening region 53a. The TiN/Ti layer and the tungsten layer are polished by means of a CMP process, whereupon electrode 55 of connection is formed in opening region 53a of second interlayer insulating film 53, and second metallic layer 66 of bonding is formed in a recess in second interlayer insulating film 53.

As shown in FIG. 26(d), after the alignment of first semiconductor substrate 10 with second semiconductor substrate 13, first and second semiconductor substrates 10 and 13 are press bonded together while being heated. As a result, first electrode 43 and second electrode 55 are bonded together, and first metallic layer 65 and second metallic layer 66 are bonded together.

In the present embodiment, the TiN/Ti layer and the tungsten layer are polished by means of a CMP process to planarize the surfaces of first and second semiconductor substrates 10 and 13. Additionally, when bonding first and second electrodes 43 and 55, first and second metallic layers 65 and 66, too, are bonded together. This enhances the strength of bonding between first and second semiconductor substrates 10 and 13. If a structure capable of keeping the potential of first and second metallic layers 65 and 66 at ground level, this reduces mutual noise between each substrate. Fast, low-power semiconductor devices can be obtained.

EMBODIMENT 13

Referring now to FIGS. 27(a, b, c, d), the fabrication of a semiconductor device of the thirteenth embodiment of this invention is illustrated.

Figure 27A:
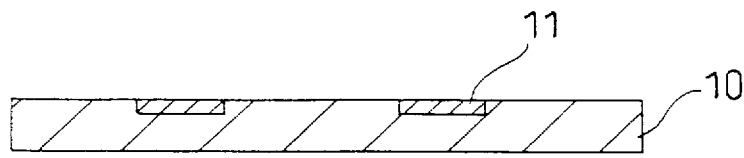
FIGS. 27(a, b, c, d) are a series of cross-sectional views which illustrate a sequence of process steps used in fabricating a semiconductor device according to a thirteenth embodiment of this invention.
Figure 27B:
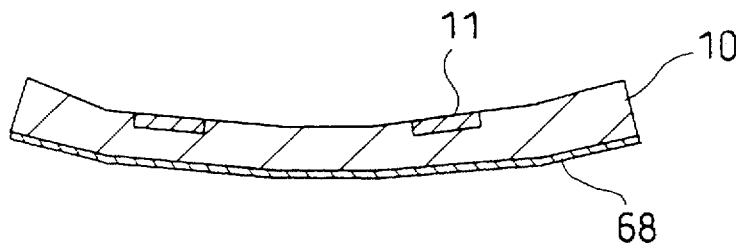
Figure 27C:
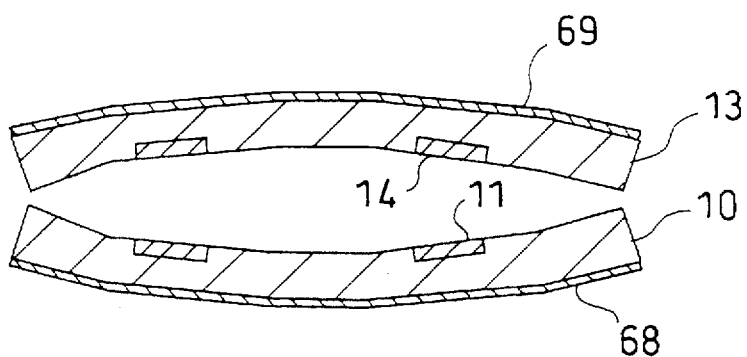
Figure 27D:
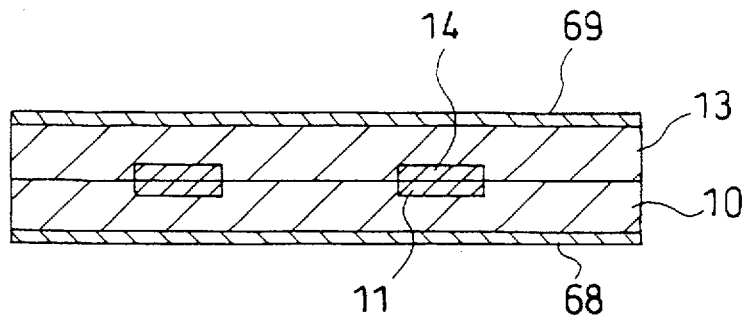

As shown in FIG. 27(a), first electrode 11 of aluminum is formed on a principal surface of first semiconductor substrate 10 having semiconductor elements including transistors, capacitance elements, and the like. This is followed by the deposition of layer 68 of silicon nitride on a surface of first semiconductor substrate 10 opposite to the principal surface thereof by means of a plasma CVD process. Likewise, as shown in FIG. 27(c), second electrode 14 of aluminum is formed on a principal surface of second semiconductor substrate 13 having semiconductor elements. This is followed by the deposition of layer 69 of silicon nitride on a surface of second semiconductor substrate 13 opposite to the principal surface thereof by means of a plasma CVD process. Because of first and second silicon nitride layers 68 and 69 having compressive stress, the principal surfaces of first and second semiconductor substrates 10 and 13 are warped, in other words they become concave.

An alignment step of aligning first and second semiconductor substrates is carried out, with first electrode 11 and second electrode 14 facing each other. Thereafter, first and second semiconductor substrates 10 and 13 are press bonded together while being heated. Uniform bonding of first semiconductor substrate 10 to second semiconductor substrate 13 is accomplished, since each substrate 10, 13 has a warped surface.

In accordance with the present embodiment, first silicon nitride layer 68 is formed on the surface of first semiconductor substrate 10 opposite to the principal surface thereof while second silicon nitride layer 69 is formed on the surface of second semiconductor substrate 13 opposite to the principal surface thereof, and first and second semiconductor substrates 10 and 13 are warped in the directions of their principal surfaces having concave forms. As a result of such an arrangement, first and second semiconductor substrates 10 and 13 can be held easily at their edges when aligning them. Additionally, small strain, occurring in first and second semiconductor substrates 10 and 13, is absorbed by great surface warping caused by first and second silicon nitride layers 68 and 69. Uniform application of pressure to first and second semiconductor substrates 10 and 13 can be accomplished during the bonding step. The extent of warping of first and second semiconductor substrates 68 and 69 can be controlled ed by adjusting the film thickness and deposition conditions of first and second silicon nitride layers 68 and 69.

EMBODIMENT 14

Figure 28:
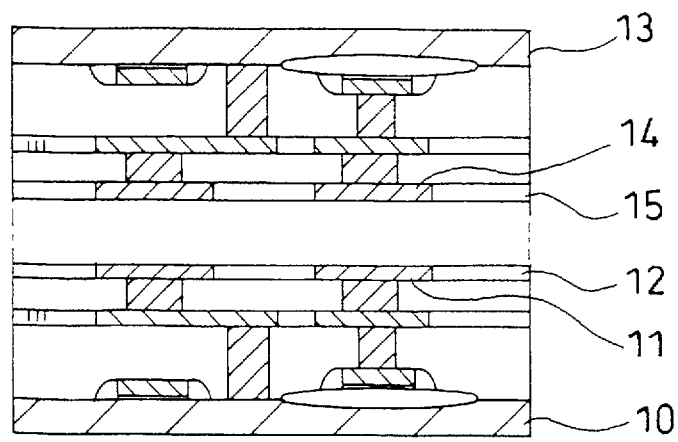
FIGS. 28(a, b, c) are a series of cross-sectional views which illustrate a sequence of process steps used in fabricating a semiconductor device according to a fourteenth embodiment of this invention.
Figure 28:
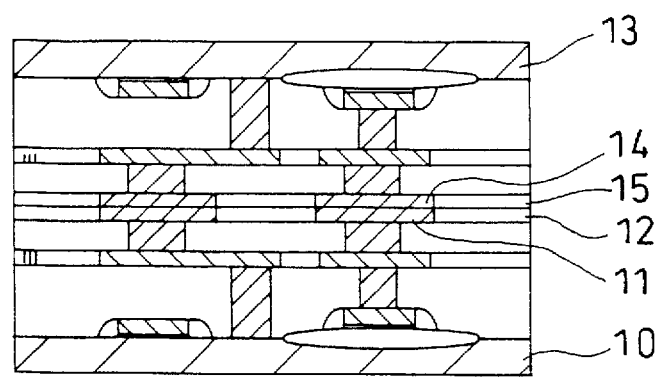
Figure 28:
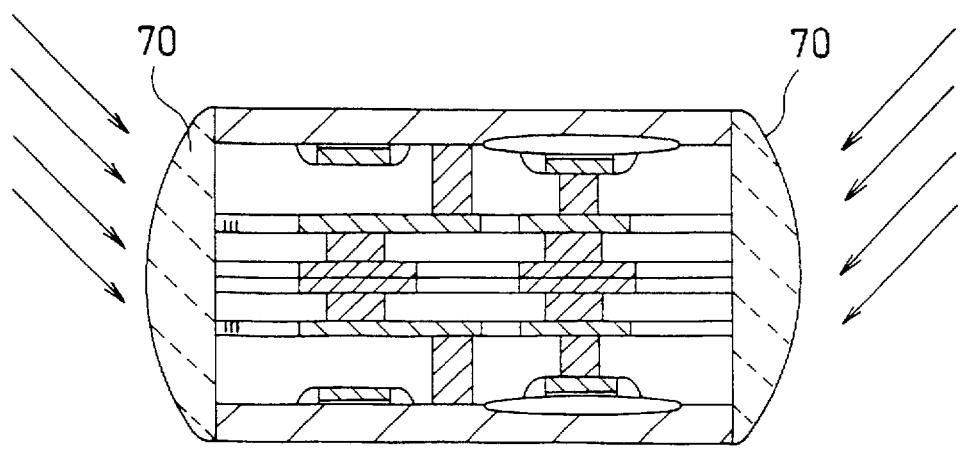

Referring now to FIGS. 28(a, b, c, d), the fabrication of a semiconductor device of the fourteenth embodiment of this invention is illustrated below.

As shown in FIG. 28(a), first electrode 11 and first insulating layer 12 of electrode insulation are formed on first semiconductor device 10 having semiconductor elements including transistors, capacitance elements, and the like. On the other hand, second electrode 14 and second insulating layer 15 of electrode insulation are formed on second semiconductor substrate 13 having semiconductor elements.

Following the alignment of first and second semiconductor substrates 10 and 13, these substrates are pressed to each other while being heated, whereupon first and second electrodes 11 and 14 are bonded together.

Next, as shown in FIG. 28(c), photoset (radiation curing) resin 70 is applied to the sidewalls of first and second semiconductor substrates 10 and 13 which are bonded together. Photoset resin 70 is then irradiated with light and becomes hard.

In accordance with the present embodiment, photoset resin 70, applied to the sidewalls of first and second semiconductor substrates 10 and 13 bonded together, becomes hard when exposed to light. This increases the mechanical bonding strength of first and second semiconductor substrates 10 and 13.

EMBODIMENT 15

Referring now to FIGS. 29(a, b, c, d) and 30(a, b), the fabrication of a semiconductor device of the fifteenth embodiment of this invention is illustrated below.

Figure 29A:
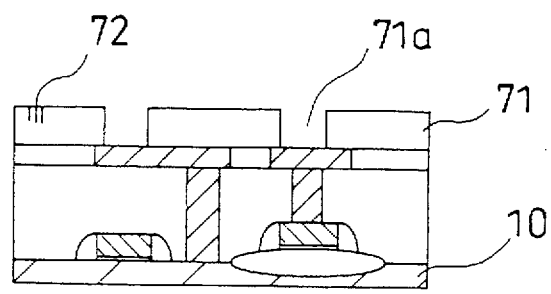
FIGS. 29(a, b, c, d) through 30(a, b, c) are a series of cross-sectional views which illustrate a sequence of process steps used in fabricating a semiconductor device according to a fifteenth embodiment of this invention.

As shown in FIG. 29(a), first insulating layer 71 which is composed of silicon oxide and which is transparent is formed on first semiconductor substrate 10 which has semiconductor elements and which is transparent. Thereafter, opening region 71a of contact and first alignment pattern 72 are formed in first insulating layer 71 at the same time.

Figure 29B:
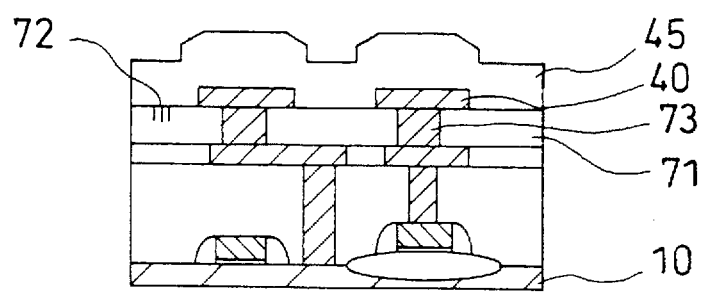
Figure 29C:
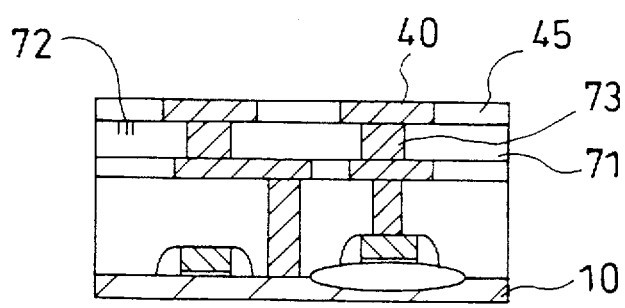
Figure 30A:
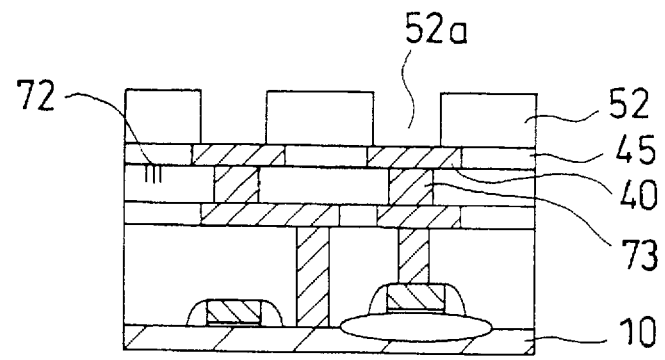

Next, as shown in FIG. 29(b), opening region 71a is filled up with a metallic layer to form first contact 73. First interconnect line 40 is formed in such a way as to be connected with first contact 73. First insulating layer 45 of silicon nitride of interconnect insulation is deposited by means of a CVD process. Next, as shown in FIG. 29(c), first insulating layer 45 is polished and planarized, and first interconnect line 40 is exposed. Likewise, second insulating layer 74 which is composed of silicon oxide and which is transparent is formed on second semiconductor substrate 13 which has semiconductor elements and which is transparent. Thereafter, an opening region of contact and second alignment pattern 75 are formed in second insulating layer 74 at the same time. Next, the opening region is filled up with a metallic layer to form second contact 76. Second interconnect line 44 is formed in such a way as to be connected with second contact 76. Second insulating layer 46 of silicon nitride of interconnect insulation is deposited on the entire surface by means of a CVD process. Next, second insulating layer 46 is polished and planarized, and second interconnect line 44 is exposed (see FIG. 30(d)).

Figure 29D:
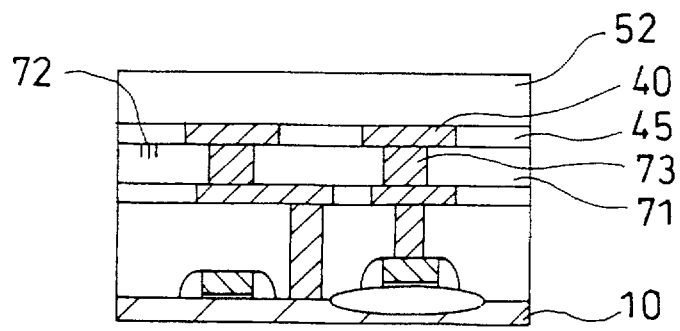
Figure 30B:
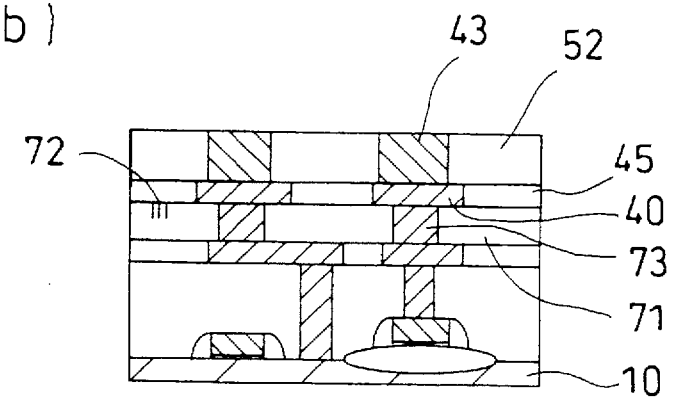

Next, as shown in FIG. 29(d), interlayer insulating film 52 composed of silicon oxide is deposited by means of a CVD process. Opening region 52a is formed in interlayer insulating film 52 by means of a photolithography process and by means of a dray etching process (see FIG. 30(a)). Thereafter, opening region 52a of interlayer insulating film 52 is filled up with tin by means of an electroless tinning process, to form electrode 43 of connection (see FIG. 30(b)).

Figure 30C:
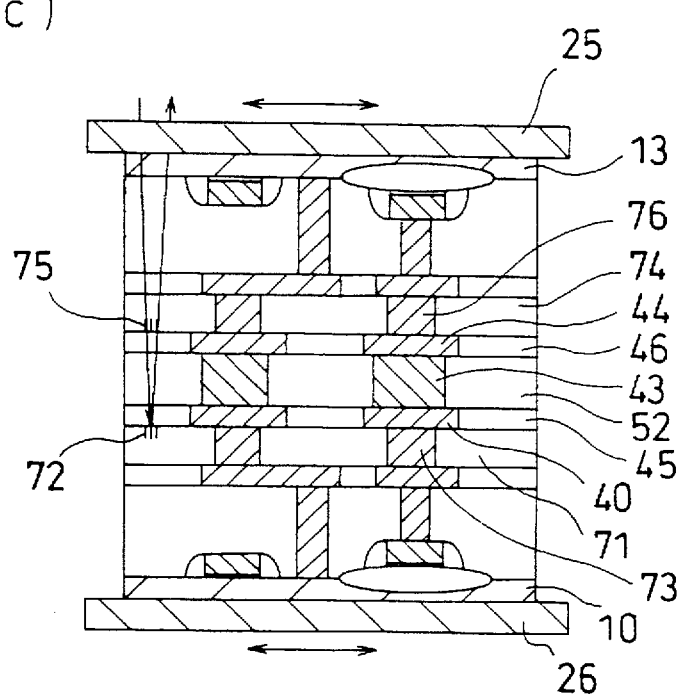

Next, as shown in FIG. 30(c), with first semiconductor substrate 10 held by lower retainer 26 capable of moving in the directions of x and y and with second semiconductor substrate 13 held by upper retainer 25 capable of moving in the directions of x and y, lower and upper retainers 25 and 26 are driven to align first semiconductor substrate 10 and second semiconductor substrate 13 with the aid of first and second alignment patterns 72 and 75. First and second semiconductor substrates 10 and 13 are pressed to each other while being heated. In this way, first and second semiconductor substrates 10 and 13 are bonded together.

The present embodiment enables optical alignment and therefore the accuracy of alignment increases. Use of a holography may accomplish an alignment step at high accuracy of 0.1 μm or less. Semiconductor substrates having thereon fine patterns of submicron design rules can be bonded together, and the accuracy of alignment and the reliability of interconnection can be improved.

EMBODIMENT 16

Referring now to FIGS. 31(a, b, c) and FIGS. 32(a, b), the fabrication of a semiconductor device of the sixteenth embodiment of this invention is illustrated.

As shown in FIG. 31(a), first interconnect line 40 and first insulating layer 45 of interconnection are formed on first semiconductor substrate 10 having semiconductor elements including transistors, capacitance elements, and the like. On the other hand, second interconnect line 44 and second insulating layer 46 of interconnection are formed on second semiconductor substrate 13 having semiconductor elements.

Next, as shown in FIG. 31(b), first resist pattern 18 is formed on first semiconductor substrate 10 while second resist pattern 19 in inverting pattern relationship with respect to first resist pattern 18 is formed on second semiconductor substrate 13.

Figure 32A:
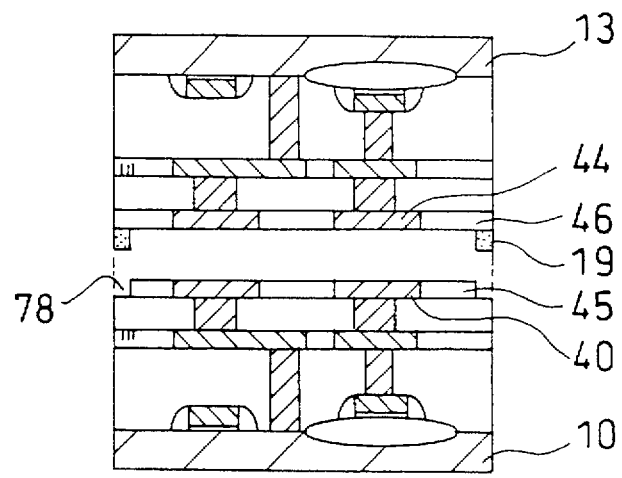

Next, as shown in FIG. 31(c), first semiconductor substrate 10 is etched using first resist pattern 18 as an etch mask, to form recess 78 of alignment. Thereafter, as shown in FIG. 32(a), an alignment step of aligning first and second semiconductor substrates 10 and 13 is performed, with recess 78 and second resist pattern 19 facing each other.

Figure 32B:
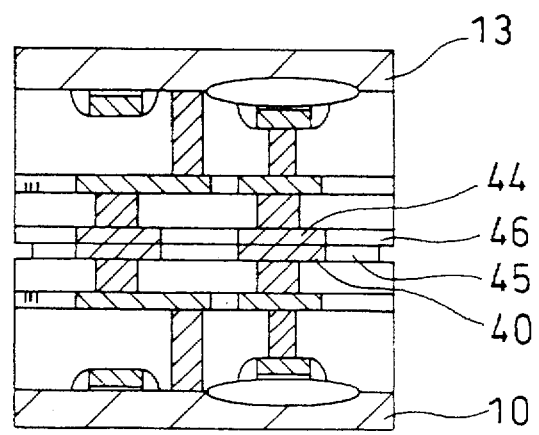
Figure 33A:
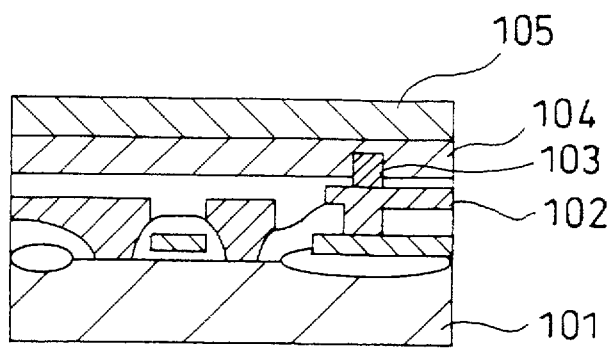
FIGS. 33(a, b, c), 34(a, b, c), 35(a, b, c, d, e, f), and 36(a, b, c, d, e,) are a series of cross-sectional views which illustrate a sequence of process steps used in fabricating a semiconductor device according to a prior art technique.
Figure 33B:
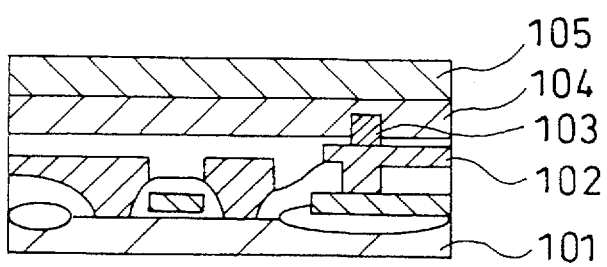
Figure 33C:
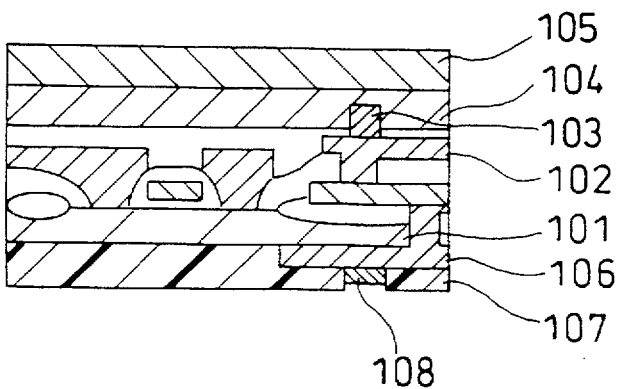
Figure 36A:
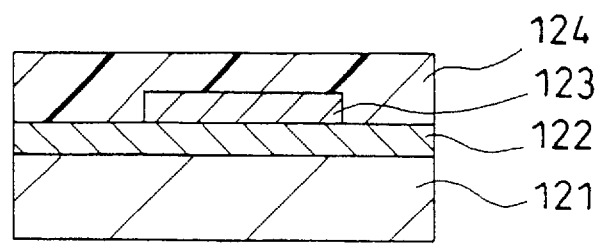
Figure 36B:
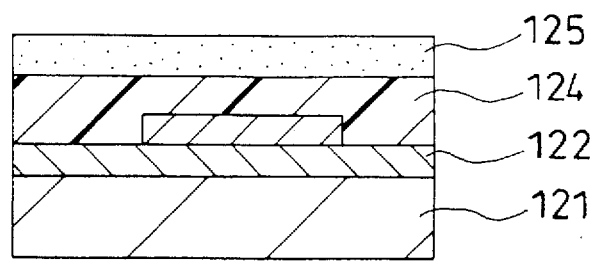
Figure 36C:
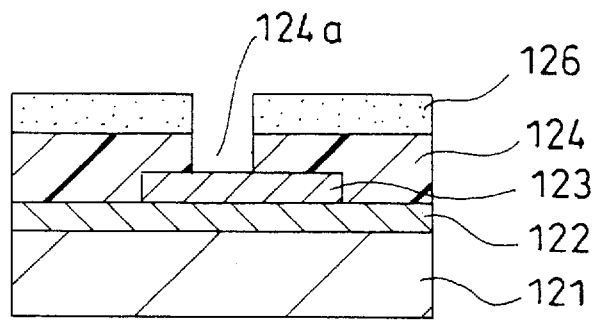
Figure 36D:
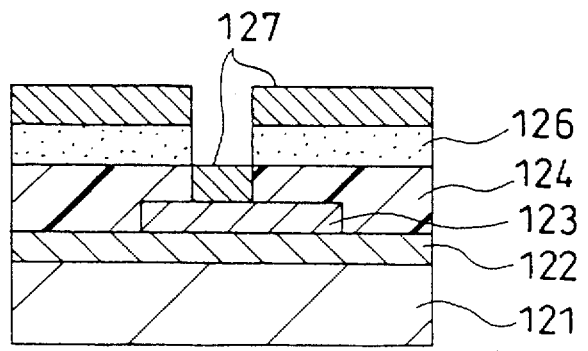
Figure 36E:
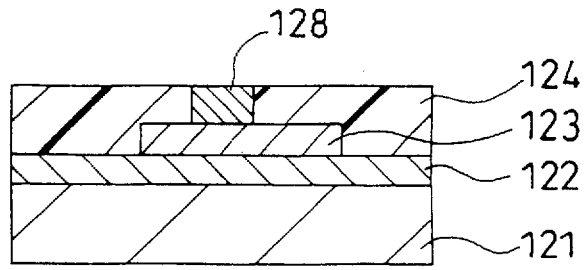

Next, as shown in FIG. 32(b), second resist pattern 19 is removed by ashing. First and second semiconductor substrates 10 and 13 are press bonded together while being heated.

In accordance with the present embodiment, first and second semiconductor substrates 10 and 13 can be aligned with each other automatically and mechanically using a conventional semiconductor fabrication technique.

In each embodiment of the present invention, tin is used to form an electrode. Other materials capable of being deposited by an electroless plating process such as nickel and silver may be used. Additionally, depending on the structure used, a selective CVD method, instead of an electroless plating method, may be employed to deposit a metallic layer of, for example, tungsten, aluminum, and copper as an electrode. There are no limitations in particular to semiconductor substrates, to the type of semiconductor elements, to interconnect lines, to the material of interlayer insulating films, and to the number of interlayer insulating film levels.

First and second semiconductor substrates 10 and 13 may be semiconductor chips or may be semiconductor wafers.

The invention claimed is:

1. A method of fabricating a semiconductor device comprising:
   (a) a first step of:
      forming, on a principal surface of a first semiconductor substrate having a first semiconductor element, a plurality of first electrodes which are electrically connected to said first semiconductor element;
      forming, on the principal surface of said first semiconductor substrate, a first insulating layer for insulating said plurality of first electrodes;
      forming, on a principal surface of a second semiconductor substrate having a second semiconductor element, a plurality of second electrodes which are electrically connected to said second semiconductor element wherein said plurality of second electrodes correspond in position to said plurality of first electrodes; and
      forming, on the principal surface of said second semiconductor substrate, a second insulating layer for insulating said plurality of second electrodes;
   (b) a second step of:
      etching said plurality of first electrodes and said first insulating layer of said first semiconductor substrate to form a plurality of projections; and
      etching said plurality of second electrodes and said second insulating layer of said second semiconductor substrate to form a plurality of recesses wherein said plurality of recesses correspond in position to said plurality of projections;
   (c) a third step of:
      bonding said first semiconductor substrate and said second semiconductor substrate by bringing said plurality of projections and said plurality of recesses into engagement with each other.

2. The method of fabricating a semiconductor device of claim 1 wherein:
   said second step includes:
      forming, on said plurality of first electrodes and on said first insulating layer, a first resist pattern, and thereafter etching said plurality of first electrodes and said first insulating layer to form said plurality of projections by making use of said first resist pattern as an etch mask;
      forming, on said plurality of second electrodes and on said second insulating layer, a second resist pattern in inverting relationship with respect to said first resist pattern, and thereafter etching said plurality of second electrodes and said second insulating layer to form said plurality of recesses by making use of said second resist pattern as an etch mask.

3. A method of fabricating a semiconductor device comprising:
   (a) a first step of:
      forming, on a principal surface of a first semiconductor substrate having a first semiconductor element, a plurality of first electrodes which are electrically connected to said first semiconductor element;
      forming, on the principal surface of said first semiconductor substrate, a first insulating layer for insulating said plurality of first electrodes;
      forming, on a principal surface of a second semiconductor substrate having a second semiconductor element, a plurality of second electrodes which are electrically connected to said second semiconductor element wherein said plurality of second electrodes correspond in position to said plurality of first electrodes;
      forming, on the principal surface of said second semiconductor substrate, a second insulating layer for insulating said plurality of second electrodes;
   (b) a second step of:
      planarizing said plurality of first electrodes and said first insulating layer; and
      planarizing said plurality of second electrodes and said second insulating layer;
   (c) a third step of:
      aligning said first semiconductor substrate and said second semiconductor substrate such that said plurality of first electrodes and said plurality of second electrodes face one another; and
   (d) a fourth step of:
      press bonding said first semiconductor substrate and said second semiconductor substrate.

4. The method of fabricating a semiconductor device of claim 3 further comprising forming a molecular layer having dangling bonds on said plurality of first electrodes and on said first insulating layer wherein said molecular layer forming step is carried out between said second and third steps;
   wherein:
      said fourth step includes bonding said first semiconductor substrate and said second semiconductor substrate by means of chemisorption of said dangling bonds to said plurality of second electrodes and to said second insulating layer.

5. The method of fabricating a semiconductor device of claim 3 wherein:
   said third step includes aligning said first semiconductor substrate and second semiconductor substrate in a liquid.

6. The method of fabricating a semiconductor device of claim 3 wherein:

said third step includes:

forming, on the principal surface of said first semiconductor substrate, a first resist pattern, and thereafter etching said first semiconductor substrate to form a recess of alignment by making use of said first resist pattern as an etch mask;

forming, on the principal surface of said second semiconductor substrate, a second resist pattern in inverting relationship with respect to said first resist pattern; and aligning said first semiconductor substrate and said second semiconductor substrate such that said recess and said second resist pattern are brought into engagement with each other.

7. The method of fabricating a semiconductor device of claim 3 wherein:

said fourth step includes:

holding said first semiconductor substrate and said second semiconductor substrate in alignment in a vacuum atmosphere; and applying a pressure by gas against at least one of surfaces of said first and second semiconductor substrates opposite to the principal surfaces thereof.

8. The method of fabricating a semiconductor device of claim 3 wherein:

said fourth step includes press-bonding said first and second semiconductor substrates in alignment while applying heat to said first and second semiconductor substrates.

9. The method of fabricating a semiconductor device of claim 3 wherein said first semiconductor substrate of said first step is transparent and has thereon an alignment mark, said semiconductor device fabrication method further comprising a fifth step of:

etching a surface of said first semiconductor substrate bonded at said fourth step to said second semiconductor substrate opposite to said principal surface thereof, to form an opening region extending to a conductive layer which is formed in said first semiconductor substrate and which is electrically connected to said first electrode, with the aid of said alignment mark; and filling up said opening region with a metallic material, to form on said first semiconductor substrate an extraction electrode that is electrically connected to an external electrode.

10. The method of fabricating a semiconductor device of claim 3 wherein:

(i) said first step includes:

forming a first metallic layer that is embedded in said first insulating layer;

forming a second metallic layer that is embedded in said second insulating layer wherein said second metallic layer corresponds in position to said first metallic layer;

(ii) said second step includes:

planarizing said first insulating layer with said first metallic layer embedded therein; and planarizing said second insulating layer with said second metallic layer embedded therein; and (iii) said fourth step includes:

bonding said first metallic layer and said second metallic layer.

11. A method of fabricating a semiconductor device comprising:

(a) a first step of:

forming, on a principal surface of a first semiconductor substrate having a first semiconductor element, a first interconnect line that is electrically connected to said first semiconductor element; and forming, on a principal surface of a second semiconductor substrate having a second semiconductor element, a second interconnect line that is electrically connected to said second semiconductor element;

(b) a second step of:

forming, on the principal surface of said first semiconductor substrate having said first interconnect line, a first interlayer insulating film having therein a first opening region wherein said first opening region corresponds in position to said first interconnect line;

forming, on the principal surface of said second semiconductor substrate having said second interconnect line, a second interlayer insulating film having therein a second opening region wherein said second opening region corresponds in position to said second interconnect line and to said first opening region;

(c) a third step of:

filling up said first and second opening regions with metal by means of an electroless plating process so as to form an electrode for establishing a connection between said first interconnect line and said second interconnect line; and (d) a fourth step of:

bonding said first semiconductor substrate and said second semiconductor substrate by applying an insulating resin therebetween.

12. The method of fabricating a semiconductor device of claim 11 wherein:

said first step includes:

forming, on the principal surface of said first semiconductor substrate having said first interconnect line, a first insulating layer for insulating said first interconnect line wherein said first insulating layer is located at the same level as said first interconnect line;

forming, on the principal surface of said second semiconductor substrate having said second interconnect line, a second insulating layer for insulating said second interconnect line wherein said second insulating layer is located at the same level as said second interconnect line.

13. The method of fabricating a semiconductor device of claim 11 wherein:

both said first interlayer insulating film and said second interlayer insulating film of said second step are resist patterns.

14. The method of fabricating a semiconductor device of claim 11 wherein:

both said first interlayer insulating film and said second interlayer insulating film of said second step are silicon oxide layers.

15. The method of fabricating a semiconductor device of claim 11 wherein said first semiconductor substrate of said first step is transparent and has thereon an alignment mark, said semiconductor device fabrication method further comprising a fifth step of:

etching, with the aid of said alignment mark, a surface of said first semiconductor substrate bonded at said fourth step to said second semiconductor substrate opposite to said principal surface thereof, to form an opening region extending to a conductive layer which is formed in said first semiconductor substrate and which is electrically connected to said first electrode; and filling up said opening region with a metallic material, to form in said first semiconductor substrate an extraction electrode that is electrically connected to an external electrode.

16. A method of fabricating a semiconductor device comprising:

(a) a first step of:

forming, on a principal surface of a first semiconductor substrate having a first semiconductor element, a first interconnect line that is electrically connected to said first semiconductor element; and forming, on a principal surface of a second semiconductor substrate having a second semiconductor element, a second interconnect line that is electrically connected to said second semiconductor element;

(b) a second step of:

forming, on the principal surface of said first semiconductor substrate having said first interconnect line, a resist pattern having an opening region wherein said opening region corresponds in position to said first interconnect line;

(c) a third step of:

filling up said opening region of said resist pattern with metal to form an electrode of connection;

(d) a fourth step of:

aligning said first and second semiconductor substrates such that said connection electrode and said second interconnect line are connected together, and press-bonding said first semiconductor substrate and said second semiconductor substrate while heating said first and second semiconductor substrates.

17. The method of fabricating a semiconductor device of claim 16 wherein:

said first step includes:

forming, on the principal surface of said first semiconductor substrate having said first interconnect line, a first insulating layer for insulating said first interconnect line wherein said first insulating layer is located at the same level as said first interconnect line;

forming, on the principal surface of said second semiconductor substrate having said second interconnect line, a second insulating layer for insulating said second interconnect line wherein said second insulating layer is located at the same level as said second interconnect line.

18. The method of fabricating a semiconductor device of claim 16 wherein:

said second step includes bringing said resist pattern to a thermoset by application of heat.

19. The method of fabricating a semiconductor device of claim 16 wherein:

said third step includes selectively forming said connection electrode by means of an electroless plating process.

20. The method of fabricating a semiconductor device of claim 16 further comprising:

a fifth step of:

removing said resist pattern sandwiched at said fourth step between said first semiconductor substrate and said second semiconductor substrate;

applying either a spin-on-glass or a thermoset resin between said first semiconductor substrate and said second semiconductor substrate; and bringing said spin-on-glass to a set to form an interlayer insulating film.

21. The method of fabricating a semiconductor device of claim 16 wherein said first semiconductor substrate of said first step is transparent and has thereon an alignment mark, said semiconductor device fabrication method further comprising a fifth step of:

etching, with the aid of said alignment mark, a surface of said first semiconductor substrate bonded at said fourth step to said second semiconductor substrate opposite to the principal surface thereof, to form an opening region extending to a conductive layer which is formed in said first semiconductor substrate and which is electrically connected to said first electrode; and filling up said opening region with a metallic material, to form in said first semiconductor substrate an extraction electrode that is electrically connected to an external electrode.

22. A method of fabricating a semiconductor device comprising:

(a) a first step of:

forming, on a principal surface of a first semiconductor substrate having a first semiconductor element, a first electrode which is electrically connected to said first semiconductor element; and forming, on a principal surface of a second semiconductor substrate having a second semiconductor element, a second electrode which is electrically connected to said second semiconductor element;

(b) a second step of:

forming, on a surface of said first semiconductor substrate opposite to said principal surface thereof, a first insulating layer capable of concaving the principal surface of said first semiconductor substrate; and forming, on a surface of said second semiconductor substrate opposite to said principal surface thereof, a second insulating layer capable of concaving said principal surface of said second semiconductor substrate;

(c) a third step of:

aligning said first and second semiconductor substrates such that said first and second electrodes face each other, and press-bonding said first and second semiconductor substrates while heating said first and second semiconductor substrates.

23. The method of fabricating a semiconductor device of claim 22 wherein:

both said first insulating layer and said second insulating layer of said second step are silicon nitride layers.

* * * * *